United States Patent
Dieny et al.

(10) Patent No.: US 8,279,666 B2
(45) Date of Patent: Oct. 2, 2012

(54) SPIN POLARISED MAGNETIC DEVICE

(75) Inventors: Bernard Dieny, Lans en Vercors (FR);
Cristian Papusoi, Grenoble (FR);
Ursula Ebels, Grenoble (FR); Dimitri Houssameddine, Grenoble (FR);
Liliana Buda-Prejbeanu, Sassenage (FR); Ricardo Sousa, Grenoble (FR)

(73) Assignees: Institut Polytechnique de Grenoble, Grenoble (FR); Le Centre National de la Recherche Scientifique, Paris (FR); Le Commissariat a l'Energie Atomique et aux Energies Altenatives, Paris (FR)

( * ) Notice: Subject to any disclaimer, the term of this patent is extended or adjusted under 35 U.S.C. 154(b) by 191 days.

(21) Appl. No.: 12/787,746

(22) Filed: May 26, 2010

(65) Prior Publication Data

US 2011/0007560 A1    Jan. 13, 2011

(30) Foreign Application Priority Data

May 27, 2009  (FR) ..................................... 09/53512

(51) Int. Cl.
*G11C 11/14* (2006.01)
(52) U.S. Cl. .......... 365/171; 365/157; 365/97; 365/158; 365/48; 365/66
(58) Field of Classification Search .................. 365/171, 365/157, 97, 158, 48, 50, 66
See application file for complete search history.

(56) References Cited

U.S. PATENT DOCUMENTS 6,545,906 B1    4/2003  Savtchenko et al.
2008/0247072 A1* 10/2008  Nozieres et al. ................ 360/59

FOREIGN PATENT DOCUMENTS

FR    2817998    6/2002
FR    2832542    5/2003

OTHER PUBLICATIONS

"Emission of spin waves by a magnetic multiplayer traversed by a current"; L. Berger; Department of Physics, Carnegie-Mellon University, Pittsburgh, Pennsylvania; Physical Review B, vol. 54, No. 13; Oct. 1, 1996; pp. 9353-9358. The American Physical Society 1996.

(Continued)

*Primary Examiner* — Thong Q Le
(74) *Attorney, Agent, or Firm* — Pillsbury Winthrop Shaw Pittman, LLP

(57) ABSTRACT

A magnetic device includes a magnetic reference layer with a fixed magnetization direction located either in the plane of the layer or perpendicular to the plane of the layer, a magnetic storage layer with a variable magnetization direction, a non-magnetic spacer separating the reference layer and the storage layer and a magnetic spin polarizing layer with a magnetization perpendicular to that of the reference layer, and located out of the plane of the spin polarizing layer if the magnetization of the reference layer is directed in the plane of the reference layer or in the plane of the spin polarizing layer if the magnetization of the reference layer is directed perpendicular to the plane of the reference layer. The spin transfer coefficient between the reference layer and the storage layer is higher than the spin transfer coefficient between the spin polarizing layer and the storage layer.

25 Claims, 7 Drawing Sheets

OTHER PUBLICATIONS

"Current-Driven magnetization Reversal and Spin-Wave Excitations in Co/Cu/Co Pillars"; Katine, J.A. et al.; Physical Review Letters, vol. 84, No. 14; Apr. 3, 2000; pp. 3149-3152. The American Physical Society 2000.

"Current Driven excitation of magnetic multilayers"; J.C. Slonczewski; IBM Research Division; Dec. 19, 1995; Journal of Magnetism and Magnetic Materials 159 (1996) L1-L7; 1996 Elsevier Science B.V.

* cited by examiner

SPIN POLARISED MAGNETIC DEVICE

CROSS-REFERENCE TO RELATED APPLICATIONS

This application is based upon and claims the benefit of priority from French patent application Ser. No. 09/53512, filed May 27, 2009, the entire content of which is incorporated herein by reference.

BACKGROUND

1. Field

This invention relates to a spin polarised magnetic device. This invention is applicable to the field of electronics, in particular for the production of memory points and MRAM (Magnetic Random Access Memory) type memory.

2. Description of Related Art

The context of the invention is that of MRAMs based on magnetic tunnel junctions (also referred to as magnetoresistive stacks) and more particularly MRAMs in which the writing operations are performed by spin transfer. FIG. 1 schematically illustrates the structure and function of such a junction bearing reference number 1. In a known manner, the magnetic tunnel junction (or magnetoresistive stack) 1 is comprised of two magnetic layers 2 and 3 separated by an oxide layer 4 forming a tunnel barrier, typically made out of aluminium or magnesium oxide. The magnetisation of one of the magnetic layers 2, referred to as a storage layer (magnetisation layer redirectable according to two substantially opposite directions) can be directed in different directions with respect to the magnetisation of the second layer 3, referred to as a reference layer, whose magnetisation is anchored in a fixed direction. This anchoring is generally performed by interaction with an adjacent antiferromagnetic layer not represented (exchange anisotropy mechanism). Different levels of resistance of the tunnel junction can be created according to the angle between the magnetisations of the two storage and reference layers. Thus, the information is stored in the magnetic element by the parallel or anti-parallel magnetic configuration of the magnetisations of the storage layer 2 and reference layer 3. The resistance variation according to the magnetic configuration is then used to read the information written in the memory cell. When the magnetisations of the magnetic layers 2 and 3 are anti-parallel, the resistance of junction 1 is increased; when the magnetisations are parallel, the resistance is reduced. The resistance variation between these two states can exceed 100% with the appropriate choice in materials. Each tunnel junction 1 constitutes a memory point.

In the most classic approach to MRAMs with writing via perpendicular magnetic fields, the tunnel junctions 1 are positioned in a square network inserted between two perpendicular networks of parallel lines: the bit lines 5 and word lines 6, with one located above and the other below the plane of the tunnel junctions 1. The junctions 1 are positioned between a transistor 7 and a bit line 5. A current passing through this bit line 5 produces a magnetic field. A current passing through the word line 6, orthogonal to the bit line 5 produces a second magnetic field. At the time of writing, transistor 7 is blocked and current pulses are sent simultaneously through the word line 6 and bit line 5, which cross each other at the level of the aforementioned memory point 1. The combination of these two fields enables the magnetisation to be switched from the storage layer of the aforementioned memory point 1 to the desired direction without affecting the magnetisation of the other memory points. In "reading" mode, transistor 7 is saturated. The current sent through the bit line 5 only crosses the memory point with an open transistor. This current enables the junction resistance to be measured. In comparison with a reference memory point, the binary state of the memory point ("0" or "1") can thus be determined.

However, the writing mechanism described above presents some difficulties.

The first problem is a problem regarding selectivity. As the reversing process of the magnetisation of the storage layer of a junction occurs under the effect of external fields and as the reversing fields are statistically distributed, some neighbouring junctions could be accidentally reversed simply due to the effect from the magnetic field produced along the address line. For high density memories, as the size of the memory points is clearly submicronic, the number of address errors increases. This selectivity problem could be improved by introducing a writing technology referred to as "toggle" technology, described in the U.S. Pat. No. 6,545,906, however at the price of an increase in electrical consumption.

Moreover, the currents required through the bit lines and word lines to create the magnetic fields required for writing are equal to several mA (typically 5 to 7 mA). When looking to increase the density of memories or logic circuits, the cross-section of these conducting lines must be reduced whereas the current required to generate magnetic field pulses remains the same order of magnitude or even increases in magnitude. This therefore quickly approaches the electromigration limits in these lines, which are reached for typical current densities of approximately $10^7$ A/cm$^2$. For a current of 4 mA, this electromigration limit, for example, is reached for conductors with cross-sections substantially equal to 200 nm*200 nm.

In more recent years, other types of magnetic devices have been developed resolving the aforementioned problem. In such devices, the reversal of magnetisation is not produced by external magnetic fields but by using the action exerted by a spin polarised current that enters into the storage layer of the tunnel junction. In fact, J C. Slonczewski and L. Berger (Journ. magn. Magn. Mater. 159, L1 (1996) and Phys. Rev. B. 54, 9353 (1996)) predicted, and J. Katine et al (Phys. Rev. Lett. 84, 3149 (2000)) experimentally observed a few years later, that when a spin polarised current is injected into a magnetic nanostructure, this current exerts a torque on the nanostructure magnetisation, referred to as spin transfer torque or spin torque, that can act on the nanostructure magnetisation and in particular that can redirect it into a desired direction. This magnetic switching phenomenon by spin transfer was firstly observed in fully metallic systems, formed for example from alternating layers of Co and Cu of the type Co 20 nm/Cu 4 nm/Co 3 nm (Phys. Rev. Lett. 84, 3149 (2000)). A few years later, this same magnetic switching phenomenon by spin transfer was observed in low resistance magnetic tunnel junctions (Appl. Phys. Lett. 84, 3118 (2004)). This spin transfer phenomenon can thus be used as a new means of writing information in MRAM-type devices or logic components. J C. Slonczewski showed that this spin transfer torque has the form of a new term in the Landau Lifshitz Gilbert equation governing the magnetisation dynamic in magnetic systems. This new term of torque T exerted by the spin current on the local magnetisation is written as $T = a_J M \times (M \times P)$ in which the prefactor $a_J$ (hereinafter referred to as the spin transfer coefficient) is proportional to the current density crossing the nanostructure and to the polarisation of this current, M is the vector representing the magnetisation of the nanostructure crossed by the spin polarised current, P is the direction of polarisation of the current and the "x" sign designates the vector product. As the prefactor of the spin transfer term is proportional to the current density crossing through the nanostructure, the current density determines the magnetisation switching limit of the magnetic nanostructure and not the total current as for the approaches involving writing by magnetic field. For example, for a magnetic nanostructure with planar magnetisation of thickness d, with a small enough dimension (typically less than 100 nm) so as to be able to consider its magnetization in macrospin approximation, the nanostructure magnetisation has been shown to be capable of switching under the influence of a spin polarised current crossing through this nanostructure perpendicular to its plane, when the prefactor of the spin transfer term reaches the value of $(a_J)_{crit} = \pm \alpha(2\pi M_s + H_K) + \alpha H_{ext} \approx \alpha 2\pi M_s$ where $\alpha$ is the Gilbert damping constant, $M_s$ is the spontaneous magnetisation of the nanostructure and $H_K$ is anisotropy field. This critical value of the prefactor $a_J$ determines the critical value of the density of this current causing the magnetic switching, given that the two magnitudes are connected by:

$$(a_J) = -\frac{|g|}{2} \frac{\mu_B}{M_s^2} \frac{1}{d} \frac{J}{e} P$$

where g (approximately equal to 2) is the Landé factor, $\mu_B$ the Bohr magneton, e the electron charge, P the current polarisation and J the current density (Sun, Phys. Rev. B. 62, 570 (2000)). It should be noted that the expression of the new term of torque T=$a_J$M×(M×P) exerted by the spin current on the local magnetisation is more particularly applicable to spin valve configurations. For a magnetic tunnel junction configuration, the new term of torque T exerted by the spin current on the local magnetisation can be written as T=$a_J$M×(M×P)+$b_J$M×P. This includes the first term $a_J$M×(M×P) to which a second term $b_J$M×P has been added, in which the prefactor $b_J$ represents the coefficient of the so-called current induced effective field term. On the contrary to the example of a spin valve, in a magnetic tunnel junction, the term of the effective field is not negligible.

Therefore, when the lateral dimension of the memory element or logic component is reduced, the current required also reduces according to the cross-section of the element, the current being equal to the product of the current density multiplied by the cross-section of the element. Thus, this writing approach by spin transfer offers improved perspectives for developing the characteristics of the memory devices or logic devices implementing these elements in comparison to a writing method involving magnetic field pulses generated by electrical current pulses through conducting lines.

When looking to use spin transfer as a means of writing in MRAMs based on magnetic tunnel junctions, the current density at which the switching occurs is a very important factor. This current density must be low enough for the following two reasons:

The first reason relates to the possibility for this current density of passing through the tunnel barrier without causing any electrical damage. In fact, when a current density j crosses a tunnel barrier with the product RA of this resistance R multiplied by its area A, a voltage V=RA*j is created between the two junction electrodes. However, the voltage is limited by each electrical breakdown (typically to values between 0.7 V and 1.5 V according to the thickness of the tunnel barrier) and the magnetoresistance tends to rapidly decrease for RA products lower than 10 $\Omega.\mu m^2$. This implies that the maximum switching current density desired so as not to generate excessive electrical stresses on the tunnel barrier with a significant level of magnetoresistance must be approximately $10^6$ A/cm$^2$ or even 6.105 A/cm$^2$.

The second reason is that the size of the selection transistor connected in series with the tunnel junction directly depends on the total current crossing the transistor. This current is typically equal to 700 µA per micron of width of the transistor canal. So that the size of the transistor does not restrict the minimisation of the size of the MRAM cell, the size of this transistor must be the same order of magnitude as the size of the junction. Given that the transistor width L is equal to the diameter of the tunnel junction, a writing current density $J_{writing}$ is obtained and must be such that the product $J_{writing}L^2$ is approximately equal to 0.7 mA/µm*L; i.e., $J_{writing}$ must be approximately equal to 0.7 mA/µm/L. A junction size L of approximately 50 nm gives a density $J_{writing}$ of approximately $7.10^5$ A/cm$^2$. Therefore, the same desired order of magnitude is observed for the switching current density as is obtained for the first reason stipulated in the previous paragraph.

However, according to the current state of the art, for tunnel junctions with a MgO base and planar magnetisation, the critical current densities observed are approximately $7.10^6$ A/cm$^2$ for a switch lasting several nanoseconds (refer to the article by Y. Huai et al, Appl. Phys. Lett. 87, 222510 (2005)). This current density is still too high with respect to the value sought to be achieved, i.e. a value lower than $10^6$ A/cm$^2$.

One first known solution for lowering the critical current is described in the patent request FR2832542. This solution consists in adding a second anchored magnetisation layer to the tunnel junction on the side of the soft layer opposite the tunnel barrier, opposite to that of the first anchored layer of the tunnel junction and separated from the soft layer by a conductive spacer with an average thickness of approximately 3 to 5 nm (configuration referred to as "dual" configuration). This thickness must be large enough to enable a magnetic uncoupling process to occur between the second anchored layer and the soft layer (typically more than 2 nm). However, this must also be small enough with respect to the spin diffusion length so that the electrons keep the memory of their spin in their passage from the second anchored layer to the soft layer. In this stack, as the tunnel barrier resistance is the dominant contributor for the electrical resistance of the stack, all of the magnetoresistance of the structure originates from the tunnel junction formed by the first anchored layer/tunnel barrier/soft layer. However, from the point of view of the spin transfer, there is a cumulative effect from the two spin transfer torques exerted by each of the two anchored layers. This is stipulated in patent FR2832542 and was later demonstrated in theory by L. Berger in article Journ. Appl. Phys. 93 (2003)7693 and experimentally checked in the article by Y. Huai et al, Appl. Phys. Lett. 87, 222510 (2005). Thus, in the latter article, the addition of a second anchored magnetisation layer opposite to that of the first anchored layer of the tunnel junction has been shown to lower the critical density switching current from approximately $7.10^6$ A/cm$^2$ to 2.2 $10^6$ A/cm$^2$. The critical current has been lowered by a factor of 3 due to this dual configuration; however this value still remains too high. Moreover, this configuration does not resolve the problems of the stochastic fluctuations in the reversing or switching time.

In fact, in a known manner, the anchoring direction of the reference layer or anchored layer is parallel or anti-parallel to the magnetisation of the storage layer. This configuration maximises the amplitude of the magnetoresistance. In any event, such a configuration requires the polarisation of the current exerting the spin transfer on the magnetisation of the soft layer to be initially parallel or anti-parallel to the magnetisation of the latter. However, as the spin transfer torque varies with the sine of the angle between the current polarisation and the magnetisation, the torque is initially zero with the effect that the switching is difficult to start. We must wait therefore until, under the effect of a random thermal fluctuation, a small angle appears between the magnetisation of the soft layer and the polarisation direction of the current so that the spin transfer torque increases and activates the magnetisation reversal. It thus follows that there is a waiting time between the start of the current pulse and the magnetisation reversal varying from several 100 ps to several 10 ns. This has been shown experimentally in the publication by T. Devolder et al (Phys. Rev. Lett. 100, 057206 (2008)). In one memory or logic component mode of operation, this waiting time is particularly disadvantageous as it restricts the operating speed of the memory or component.

A second solution to lower the critical switching current density is also described in the patent request FR2832542. This solution consists in using magnetisation material perpendicular to the plane of the layers. In fact, when a planar polarisation current in injected into a planar magnetisation nanostructure, the critical current density is expressed by $$J_{WRin-plane} = \left(\frac{2e}{\hbar}\right)\frac{\alpha t_F}{P}\left(\frac{\mu_0 M_S^2}{2} + 2K\right)$$

where e is the electron charge, $\hbar$ is the Planck constant, $t_F$ is the thickness of the nanostructure, $\alpha$ is the Gilbert damping constant, P is the current polarisation, J is the current density, $\mu_0$ is the vacuum permeability, $M_s$ is the magnetisation of the nanostructure and K is its anisotropy (Sun, Phys. Rev. B. 62, 570 (2000)). In this expression, the term $$\frac{\mu_0 M_S^2}{2}.$$

represents the energy of the demagnetising field, which is generally much higher (typically by 1 to 2 order of magnitudes) than the anisotropy energy of the nanostructure. This term is associated with the fact that, when reversing the magnetisation, the latter must precess out of the plane of the layer, the cost of which is this energy from the demagnetising field. This leads to the aforementioned current densities of approximately $7.10^6$ A/cm$^2$ for simple tunnel junctions with planar magnetisation. However, if a perpendicular magnetisation nanostructure is used, in which a perpendicular polarisation spin current is injected, the switching current density becomes $$J_{WRout-of-plane} = \left(\frac{2e}{\hbar}\right)\frac{2\alpha t_F K_{eff}}{P}$$

in which $K_{eff}$ represents the effective anisotropy of the nanostructure. This effective anisotropy groups together the shape anisotropy (i.e. demagnetising field anisotropy) tending to draw the magnetisation in the plane of the layer and perpendicular anisotropy (of volume or interfacial origin), tending to draw the magnetisation out of the plane. It thus follows that this effective anisotropy $K_{eff}$ is generally much lower than the term $$\frac{\mu_0 M_S^2}{2} + 2K$$

governing the critical current in the planar example. Consequently, smaller critical currents are expected to be obtained in perpendicular anisotropy than for planar magnetisation materials. Recent experimental results (Yoda et al, presented orally at Intermag 2008, Madrid FA04) have shown critical currents of $3.10^6$ A/cm' in TbCo/CoFeB2 nm/MgO/CoFeB1 nm/GdCo type perpendicular magnetisation structures. This result is encouraging, however remains too high, which appears to indicate that the $\alpha$/P ratio is higher in these out-of-plane magnetisation materials than with "normal" planar magnetisation materials. Perpendicular magnetisation materials must therefore be found with a low Gilbert damping constant and a high spin polarisation and offering a large amplitude of magnetoresistance (only 10% in the aforementioned study). Moreover, this configuration does not resolve the problem of the stochastic fluctuations in the magnetisation reversing time.

Another approach suggested in patent FR2817998 consists, in order to incite the switching of a planar magnetisation magnetic layer, in injecting a spin polarised current into this layer, with a polarisation direction perpendicular to the plane of the layers. Such a magnetic device 30 is illustrated in FIG. 2. The represented device 30 comprises an antiferromagnetic layer 10, a tri-layer stack 12 consisting of two magnetic layers 121 and 123 with anti-parallel planar magnetisations, separated by a non-magnetic conducting layer 122. This stack comprises the anchored layer. The device 30 also comprises an insulating layer 14 and a free magnetic layer 16. The group comprising 12, 14 and 16 constitutes a magnetic tunnel junction 15. Device 30 is complemented with a non-magnetic conducting separating layer 18 and a magnetic polarisation layer 20 with a magnetisation perpendicular to the plane of the layer. This layer 20 can be comprised of a stack of layers, made out of for example Fe/Pt, Fe/Pd, Co/Pt, Co/Pd or Co/Au etc. or made out of their ordered alloys. The polarisation layer rests on a conductor substrate 22. This entire stack is inserted between a current feed 24 and a current switching transistor 26. For the electrons transmitted through layer 20 or reflected by the latter, the spin direction is found to be directed parallel to the magnetisation of this layer, i.e. perpendicular to the plane of the various layers of junction 15 and in particular to the plane of free layer 16. The magnetisation of this layer subjected to this out-of-plane current of polarised electrons will turn according to a large angle cone with an axis perpendicular to the plane of the layer, without being capable of aligning itself with the spin direction due to the demagnetising field tending to maintain the magnetisation within the plane of the layer. FIG. 3 symbolically shows this rotation with a positive direction of current. An Oxyz trirectangular trihedron enables the different directions to be located, the Oz axis being perpendicular to the plane of the layers. In this patent FR2817998, out-of-plane magnetisation layer 20 was presumed to influence the dynamics of the magnetisation of layer 16 in a much more significant manner than the reference layer 123. In other words, layer 20 is mainly responsible for the precession movement of the magnetization of layer 16 when a current with an intensity level higher than the critical precession current travels through the structure, whereas layer 123 only mildly disturbs this precession movement by making it asymmetrical, promoting the parallel alignment of the magnetisations of layers 123 and 16 if the current is positive and anti-parallel if the current is negative. In the example shown in FIG. 3, the current being positive, the parallel state is therefore promoted. This is represented in FIG. 4 by an alternative variation in the magnetisation My of layer 16 with shorter My magnetisation maximums (of duration t2) and longer My magnetisation minimums (of duration t1). Thus, in this patent, the parallel state of the magnetisations of layer 16 and 123 (representing for example a "0") or the anti-parallel state of magnetisation (representing for example a "1") can be written with either of the current directions, however the duration of the current pulse must be controlled with precision in order to stop either on a low plateau ("0") or on a high plateau ("1").

According to this geometry, the effect from the spin transfer causes the magnetisation to precess on a cone around an axis perpendicular to the plane of the layers. Thus, when a continuous current traverses the structure, the magnetisation of the free layer 16 precesses in a continuous manner (i.e. it turns on itself in a continuous manner with maintained oscillations of My and Mx components and thus of the resistance of the junction). It should be noted that if device 30 only comprised the perpendicular polariser 20 and the soft layer 16 of which the magnetisation is precessing, no resistance variation of the stack would be produced associated with this precession movement, as the angle between the magnetisations of the perpendicular polariser and the soft layer is constant throughout the precession movement. In order to obtain a magnetoresistance effect that can be used in an MRAM application or a radiofrequency oscillator, the anchored reference layer 123 with planar magnetisation must be added, separated from the soft layer 16 by a non-magnetic spacer. By controlling the duration of the precession movement generated by the perpendicular polariser to the nearest alternation, the precession movement can be used to switch the magnetisation of the planar magnetisation layer 16 between two opposite directions. The advantage of this approach is that the switch is in principle very fast (approximately 0.3 ns) and not very sensitive to stochastic fluctuations. In any event, the precession frequencies involved typically equal several GHz. This means that, in order to perform a precession alternation to the magnetisation of the planar layer, the duration of the current pulse traversing this layer must be controlled to a level of precision of approximately 0.1 ns. In a memory chip-type electronic device, this is very difficult to achieve as the inductive and capacitive effects produced during the distribution of current pulses within the conducting lines causes delays and enlarged pulses. These deformations of the electrical signal are detrimental for the implementation of this precessional switch in a memory device.

SUMMARY

In this context, the purpose of this invention is to provide a magnetic device enabling the aforementioned requirements regarding the duration of current pulses crossing the device connected to the raised precession frequencies to be overcome, while reducing the stochastic fluctuations in the magnetisation reversal time and the critical current density for magnetisation reversal.

To this end, the invention relates to a magnetic device comprising:
a first magnetic layer, referred to as a reference layer, with a fixed magnetisation direction located either in the plane of the reference layer or perpendicular to the plane of the reference layer;
a second magnetic layer, referred to as a storage layer, with a variable magnetisation direction;
a non-magnetic layer, referred to as a spacer, separating said reference layer and said storage layer;
a third magnetic layer, referred to as a spin polarising layer with a magnetisation perpendicular to that of said reference layer and located out of the plane of the spin polarising layer if the magnetisation of the reference layer is directed in the plane of the reference layer or in the plane of the spin polarising layer if the magnetisation of the reference layer is directed perpendicular to the plane of the reference layer;
means for passing a current of electrons through and perpendicular to the layers;
said device being characterised in that said variable magnetisation direction has two positions of equilibrium substantially following the axis defined by said fixed magnetisation direction of said reference layer, the spin transfer coefficient between said reference layer and said storage layer being higher than the spin transfer coefficient between said spin polarising layer and said storage layer in such a way that, when in the presence of a current of electrons:
the spin transfer between said spin polarising layer and said storage layer moves the magnetisation direction of said storage layer away from a first position of equilibrium parallel or anti-parallel to the magnetisation direction of said reference layer, and,
the spin transfer between said reference layer and said storage layer causes, according to the direction of the current of electrons:
either the switching of the magnetisation direction of said storage layer towards a second position of equilibrium corresponding to a magnetisation direction of said storage layer opposite to the magnetisation direction of said storage layer in said first position of equilibrium if the direction of the current of electrons is in a first direction;
or the reversal of the magnetisation direction of said storage layer towards its magnetisation direction in said first position of equilibrium if the direction of the current of electrons is in the direction opposite to the first direction.

In a general manner, the spin transfer coefficient $a_j$ is defined via the torque T exerted by the spin current on the local magnetisation given by the equation: $T=a_j M \times (M \times P)$ where P is a unit vector directed in the direction of the spin polarised current and where M is the magnetisation vector of the storage layer.

Conform to use, a magnetoresistive element comprising at least one hard ferromagnetic layer and one soft ferromagnetic layer separated by a non-ferromagnetic spacing layer (metallic or insulating) is referred to as a "magnetoresistive stack" or "magnetic tunnel junction". This element will hereinafter be referred to as a "magnetoresistive stack".

The device according to the invention comprises a magnetic storage layer with a magnetisation capable of being redirected between two substantially opposite either in-plane or out-of-plane directions, sandwiched between two magnetic layers with fixed magnetisation, one directed in the plane of the layers, the other directed perpendicular to the plane of the layers. The binary information is encoded by the direction of the magnetisation of the storage layer relative to that of the reference layer. The reference layer is inserted into a stack of layers comprising the means to transmit an electrical current perpendicular to the plane of the magnetic layers. The device according to the invention has magnetoresistive properties, i.e. the two stable magnetic states are characterised by two different electrical resistance values of the device. The stack can be a magnetoresistive stack, a metallic structure, a confined current paths structure with high level of magnetoresistance, or a structure referred to as a spin filter comprising a magnetic oxide barrier. The switch from one magnetic state to another is produced by spin transfer, i.e. with the use of a spin polarised current crossing the storage layer.

The spin transfer coefficient (or prefactor) between the reference layer and the storage layer is higher than the spin transfer coefficient between the spin polarisation layer and the storage layer. In other words, the influence from the spin transfer due to the first anchored layer (reference layer) is higher than the influence from the spin transfer due to the second anchored layer (spin polarisation layer).

In the aforementioned patent request FR2817998, the reference layer only slightly disturbs the precession movement generated by the perpendicular polariser by inducing plateau asymmetry as shown in FIG. 4. In this patent request FR2817998, the spin transfer coefficient originating from the perpendicular polariser is much higher than the spin transfer coefficient originating from the reference layer. This reference layer does not disturb the magnetisation dynamics generated by the perpendicular polariser in a significant manner, with its main role consisting in producing the magnetoresistive signal. On the other hand, according to this invention, the spin transfer exerted by the reference layer plays a dominant role with respect to the spin transfer exerted by the perpendicular polariser; it is the reference layer that plays the principal role on the magnetisation dynamics, with the polarisation layer only helping to reduce the critical switching current.

If the magnetoresistive structure was alone, i.e. without the perpendicular magnetisation polariser layer, one of ordinary skill in the art can thus switch the magnetisation of the storage layer by spin transfer effect, i.e. make a spin polarised current pass through the structure. In fact, the electrons become polarised when crossing the magnetic reference layer and exert a magnetic torque on the magnetisation of the storage layer. When this torque is strong enough, the magnetisation of the storage layer can be switched. If the electrons pass from the reference layer towards the storage layer, this is known to promote the parallel alignment of the magnetisations. If, on the other hand, the electrons pass from the storage layer towards the reference layer, this is known to promote the anti-parallel alignment of the magnetisations. The perpendicular polariser is then added to this known bi-stable magnetoresistive element. In doing this, a second spin transfer contribution is added originating from the polarisation of the current induced by the perpendicular polariser. However, this second spin transfer contribution exerted on the storage layer is designed to be lower than the contribution provided by the reference layer. Thus, the storage layer remains a bi-stable component, despite the presence of the perpendicular polariser. In other words, under these conditions and contrary to the magnetic device in the patent request FR2817998, the magnetisation of the storage layer does not become involved in a maintained precession movement, but continues to switch with respect to the magnetisation of the reference layer as in the example of the magnetoresistive element alone, i.e. towards the parallel state if the electrons pass from the reference layer to the storage layer and towards the anti-parallel state if the electrons pass from the storage layer to the reference layer. The benefit obtained from adding the perpendicular polarisation layer with a smaller effect on the spin transfer than the reference layer nevertheless comprises two main advantages:

it enables the critical switching current density to be significantly reduced (typically by a factor of 2 to 10). The spin transfer originating from the perpendicular polariser provides additional torque to the magnetisation of the storage layer that is added to the torque provided by the reference layer and thus helps in switching the magnetisation of the storage layer. Thus, the storage layer can be switched at a lower current density than in the situation where the perpendicular polariser is not present. It should be emphasized that the perpendicular polariser alone is not enough in this invention to switch and all the more make the magnetisation of the storage layer precess;

the presence of the additional polarisation layer reduces the stochastic fluctuations in the switching time of the magnetisation of the storage layer. In fact, without this additional polariser, the magnetisations of the storage and reference layers are initially parallel or anti-parallel. As a result, the spin transfer torque exerted at the very beginning of the switch is very weak, as this torque varies with the sine of the angle between the magnetisations of the reference and storage layers (sine close to zero when the magnetisations are parallel or anti-parallel). Therefore, the magnetisation switching is activated in a random manner when a thermal fluctuation deviates the magnetisation of the storage layer from its direction of equilibrium. This causes an uncertainty in the time required for the magnetisation to switch, which is disadvantageous in the perspective of using this phenomenon for writing MRAM cells. However, in the presence of the additional polarisation layer, the situation is not the same. In fact, the magnetisation of the polarisation layer is substantially orthogonal to that of the storage layer. The spin transfer torque is therefore at its maximum as from the very beginning of the writing current pulse. Consequently, although this torque from the perpendicular polariser is too weak to switch the magnetisation alone, it is nevertheless strong enough to subject the magnetisation to a pulse which diverts it from its position of equilibrium in a very short time of approximately 50 ps. As a result, this enables the spin transfer from the reference layer to very quickly take over and cause the magnetisation of the storage layer to switch. Thus, with the polarisation layer, the reversal is no longer activated by a random thermal fluctuation but by the current pulse crossing the magnetic element itself. This makes the switching process much faster and its duration much less fluctuating.

At no moment in time, in the presence of a continuous current, does the magnetisation of the storage layer precess, and therefore oscillate in a continuous manner. Once the magnetisation has switched, it remains in this new state and does not continue to rotate.

The magnetic device according to the invention can also have one or several of the characteristics described hereinafter, considered either on an individual basis or according to any combination technically possible:

said storage layer has a uni-axial anisotropy with an easy axis of magnetisation substantially parallel to the magnetisation direction of said reference layer;

said storage layer has an extended shape such as an elliptical shape;

the device according to the invention comprises a layer, referred to as a second spacer, separating said storage layer and said spin polarising layer;

the electrical resistance of the stack formed from said reference layer, said first spacer and said storage layer is higher than the electrical resistance of the stack formed from said second spacer and said spin polarising layer;

the product of the resistance multiplied by the surface area of said first spacer is higher than the product of the resistance multiplied by the surface area of said second spacer;
said first spacer is a tunnel barrier and said second spacer is chosen from among the following elements:
  a tunnel barrier;
  a confined current paths barrier;
  a non-magnetic metallic layer;
said first spacer is a confined current paths barrier and said second spacer is chosen from among the following elements:
  a confined current paths barrier;
  a non-magnetic metallic layer;
said second spacer is a confined current paths barrier with additional metallic paths and/or magnetic paths with larger diameters than in the first spacer;
said first and second spacers are non-magnetic, metallic layers;
said layer of spin polarised electrons is directly coupled with said storage layer;
said reference layer has a fixed magnetisation direction located in the plane of the reference layer and said spin polarising layer has a magnetisation perpendicular to that of said reference layer and located out of the plane of the polarisation layer;
said spin polarising layer is created according to one of the following layouts:
  a multilayer comprising (Pt/Co), (Pd/Co) or (Pt/Co/Pt/Ni) repeats;
  a multilayer formed by alternating ultra-thin layers of Co and Ni;
  a multilayer formed by alternating magnetic transition metal/oxide;
  an FePt or FePd ordered alloy;
  a CoPt or CoPd alloy with Co concentrations of between 85 at. % and 50 at. %;
  a CoCr alloy with a hexagonal structure with a c-axis perpendicular to the plane of the layers;
  a rare-earth/transition metal alloy;
said storage layer is created from one of the following materials:
  an alloy with a Co, Fe, Ni base possibly containing additives, in particular B, Cr, Pt, Pd, Zr and Nb;
  a Heusler alloy;
said reference layer is created from one of the following materials:
  an alloy with a Co, Fe, Ni base possibly containing additives, in particular B, Cr, Pt, Pd, Zr and Nb;
  a semi-metallic material, en particular from the family of Heusler alloys;
said reference layer has a fixed magnetisation direction perpendicular to the plane of the reference layer and said spin polarising layer has a magnetisation direction perpendicular to that of said reference layer and located in the plane of the spin polarisasing layer;
said spin polarising layer is created from one of the following materials:
  an alloy with a Co, Fe, Ni base possibly containing additives, in particular B, Cr, Pt, Pd, Zr and Nb;
  a Co multilayer containing thin Cu or Ni inserts;
  a semi-metallic material, en particular from the family of Heusler alloys;
said storage layer and/or said reference layer are created according to one of the following layouts or materials:
  a multilayer comprising (Pt/Co), (Pd/Co) or (Pt/Co/Pt/Ni) repeats;
  a multilayer formed by alternating layers of Co and Ni;
  a multilayer formed by alternating a magnetic transition metal and an oxide;
  an FePt or FePd ordered alloy;
  a CoPt or CoPd alloy with Co concentrations of between 85 at. % and 50 at. %;
  a CoCr alloy with a hexagonal structure with a c-axis perpendicular to the plane of the layers;
  a rare-earth/transition metal alloy;
at least one of said reference layers, storage layers or spin polarising layers is a synthetic antiferromagnetic layer formed from two layers of fixed magnetisation directed outside of the plane and coupled in an anti-parallel direction with a layer capable of inducing an antiferromagnetic coupling between the ferromagnetic layers.
at least one of said reference layers or layers of spin polarised electrons has a magnetisation anchored via interaction with an antiferromagnetic anchoring layer.

The purpose of this invention also includes a method of writing/reading information in a device according to the invention, characterised in that the writing of information consists in passing a current of electrons through the device, perpendicular to the plane of the layers, the switching of the magnetisation direction of said storage layer towards the second position of equilibrium being performed by injecting a current of electrons in a first direction and the switching of the magnetisation direction of said storage layer towards the first position of equilibrium being performed by injecting a current of electrons in a second direction opposite to said first direction of the current.

Advantageously, the reading of information consists in passing a current of electrons through the device, perpendicular to the plane of the layers and in measuring the resistance of said device, the intensity of the reading current being lower than the intensity of the writing current.

BRIEF DESCRIPTION OF THE DRAWINGS

Other characteristics and advantages of the invention can be clearly observed in the following description, which is given as a rough guide and in no way as a limited guide, with reference to the appended figures, from which.

DETAILED DESCRIPTION

FIGS. 1 to 4 have already been described with reference to the state of the art.

An Oxyz trirectangular trihedron enables the different directions to be located, the Oz axis being perpendicular to the plane of the layers.

Figure 1:
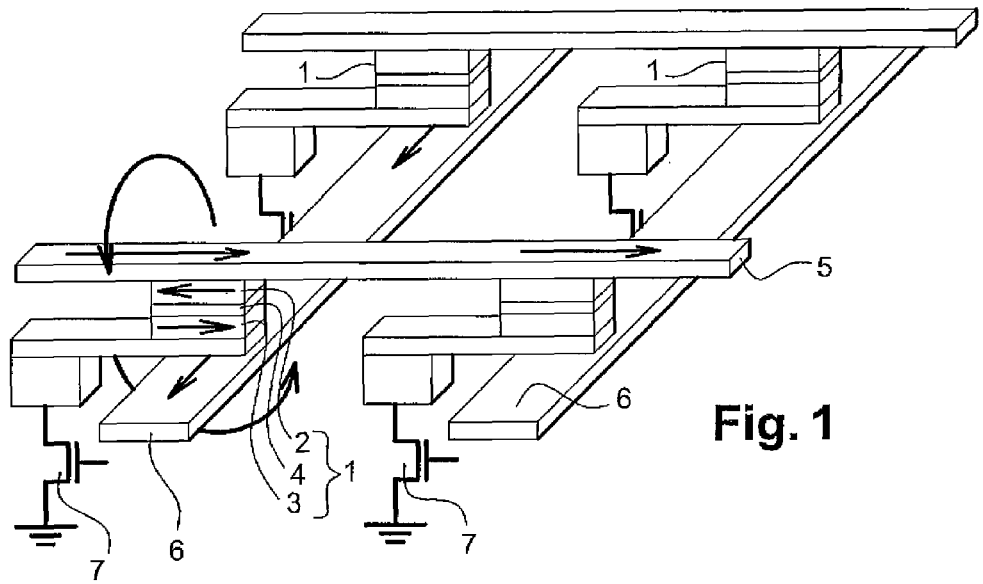
FIG. 1 schematically a set of magnetic tunnel junctions illustrating the structure and function of a magnetic tunnel junction.
Figure 2:
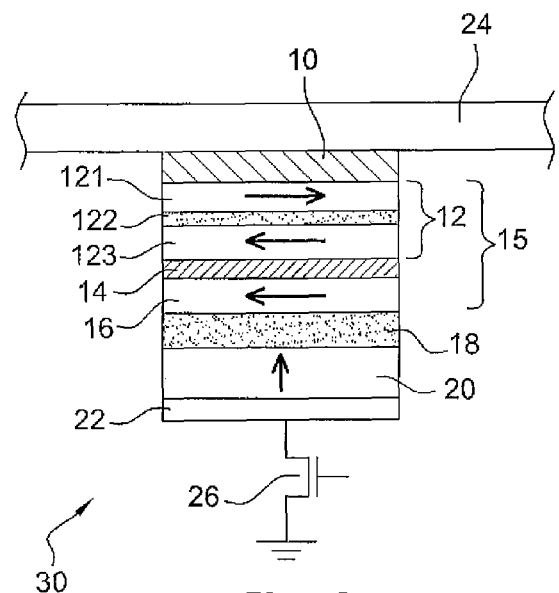
FIG. 2 illustrates a magnetic device according to the state of the art.
Figure 3:
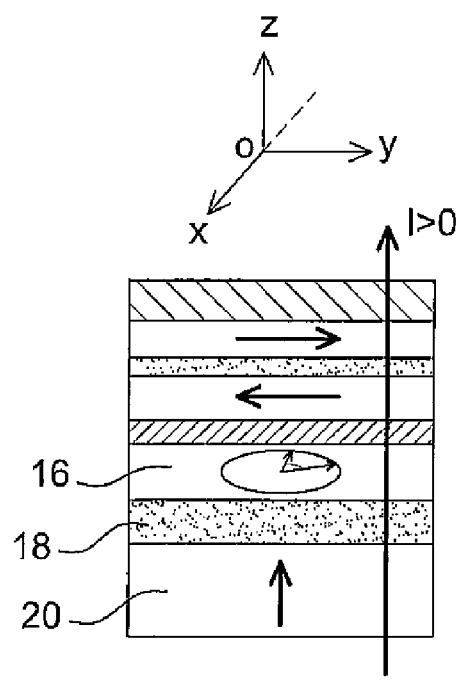
FIG. 3 displays the magnetisation directions in the different layers according to a positive direction of current circulation for the device in FIG. 2.
Figure 4:
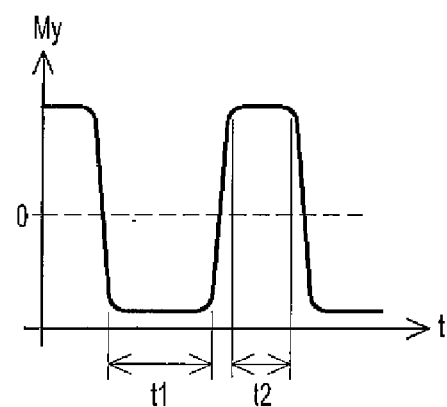
FIG. 4 displays the variations in the magnetisation component following an Oy axis parallel to the plane of the layers according to the direction of the current passing through the stack illustrated in FIG. 3.
Figure 5:
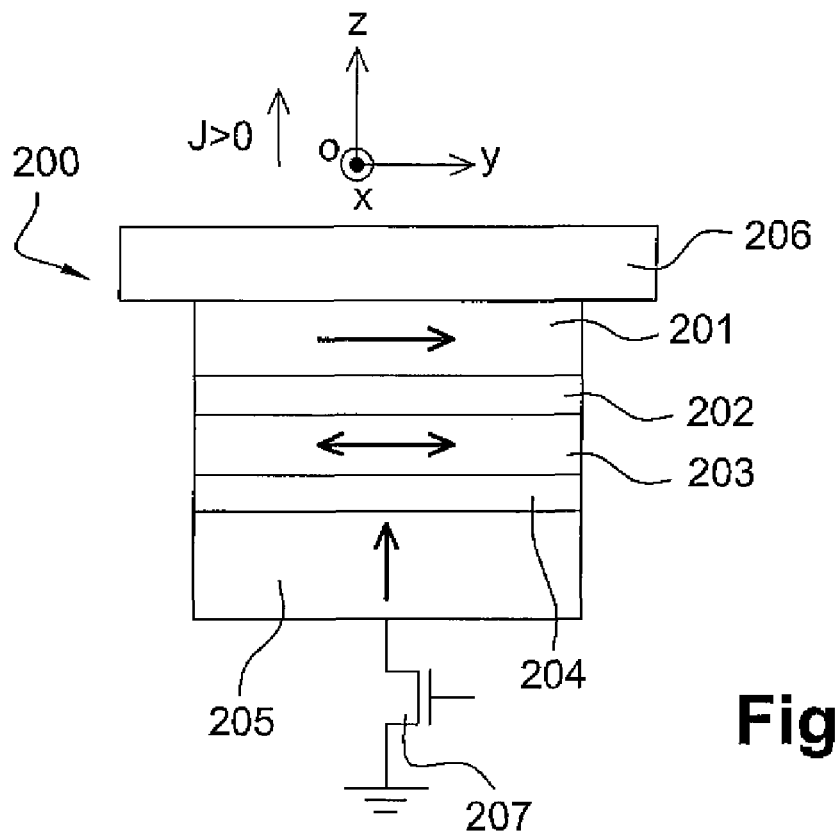
FIG. 5 schematically represents a device according to the invention.

FIG. 5 schematically represents a magnetic device 200 according to the invention.

The magnetic device 200 comprises:
a magnetic reference layer 201 with a fixed magnetisation direction (in this case located in the plane of the reference layer);
a first non-magnetic spacer 202;
a magnetic storage layer 203 with a magnetisation capable of being redirected according to two substantially opposite states of direction (two positions of equilibrium substantially following the axis defined by the fixed magnetisation direction of the reference layer 201);
a second spacer 204;
a layer 205 generating spin polarised electrons with a magnetisation located out of the plane of the polarisation layer and with a direction perpendicular to that of the reference layer 200.

This stack formed from the set of layers described above is inserted between a current feed 206 and a means for current switching 207, which in this example is a transistor enabling an electrical current to travel perpendicular to the plane of the stack of magnetic layers.

The stack has magnetoresistive properties, i.e. the two stable magnetic states are characterised by two different electrical resistance values of the structure. The stack can be a magnetoresistive stack, a metallic structure, a confined current paths structure with high level of magnetoresistance, or a structure referred to as a spin filter comprising a magnetic oxide barrier. The switch from one magnetic state to another is produced by spin transfer, i.e. with the use of a spin polarised current crossing the storage layer 203.

The second spacer 204 has a resistance less than that of the magnetoresistive element formed by the reference layer 201 and the storage layer 203 separated by the first non-magnetic spacer 202. The electrical resistance of the second spacer 204 must in fact be low enough with respect to that of the magnetoresistive element so that the magnetoresistance effect of the device 200 is not reduced too much by the serial resistance of the spacer 2. The second spacer 204 is in contact with the storage layer 203 on the opposite side of the magnetoresistive element.

The layer 205 generating spin polarised electrons is in contact with the second spacer 204.

The reference layer 201 and layer 205 generating spin polarised electrons are chosen so that the spin transfer coefficient between the reference layer 201 and the storage layer 203 is higher than the spin transfer coefficient between the spin polarising layer 205 and the storage layer 203.

Figure 6:
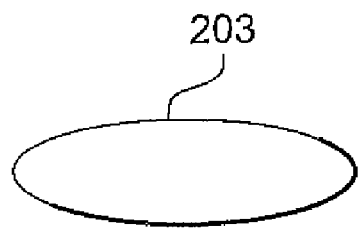
FIG. 6 represents an top view of the storage layer used in the device in FIG. 5.

The storage layer 203 preferably has a uni-axial anisotropy capable of being generated by giving the structure an extended elliptical shape. This uni-axial anisotropy provides the magnetisation of the storage layer 203 two stable magnetisation states substantially parallel and anti-parallel to the magnetisation of the reference layer 201. FIG. 6 displays a top view of the storage layer 203, elliptical in shape.

Figures 7A, 7B:
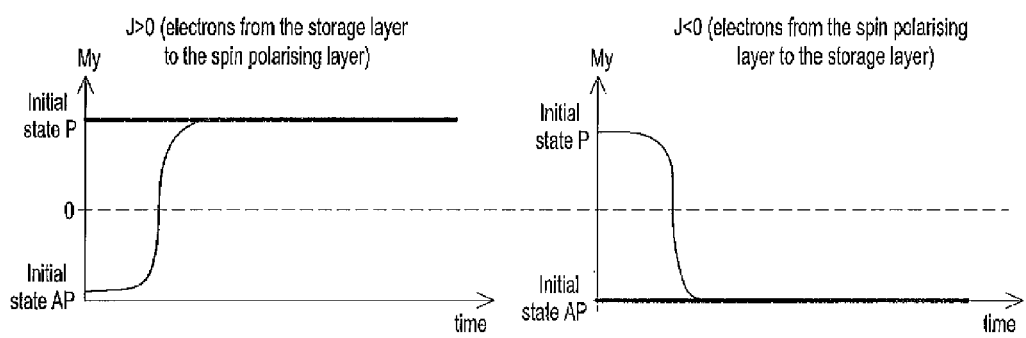
FIGS. 7 A and 7 B represent the variations in the magnetisation component My following an Oy axis parallel to the plane of the layers of the device in FIG. 5.

If the magnetoresistive element formed by the reference layer 201 and the storage layer 203 separated by the first non-magnetic spacer 202 was alone, i.e. without the second spacer 204 and the perpendicular polarisation layer 205, the magnetisation of the storage layer 203 could be switched by spin transfer effect, i.e. by passing a spin polarised current through the structure. In fact, the electrons become polarised when crossing the magnetic reference layer 201 and exert a magnetic torque on the magnetisation of the storage layer 203. When this torque is strong enough, the magnetisation of the storage layer 203 can be switched. If the electrons pass from the reference layer 201 towards the storage layer 203, this promotes the parallel alignment of the magnetisations. If, on the other hand, the electrons pass from the storage layer 203 towards the reference layer 201, this promotes the anti-parallel alignment of the magnetisations. This is described, for example, in the article Y. Huai et al (Applied Physics Letters 84, 3118 (2004)). In this example, the quasistatic critical switching current densities are typically approximately equal to $5.10^6$ A/cm$^2$, reaching approximately $2.10^7$ A/cm$^2$ for current pulse switching with a duration of approximately one nanosecond. These current densities are relatively high when used in MRAM-related applications. They require the size of selection transistor 207 connected in series with the magnetoresistive element to be much larger than the size of the magnetoresistive element. Moreover, in the example where the magnetoresistive element is a magnetoresistive stack of the product RA (resistance R multiplied by surface area A) typically of approximately 5 $\Omega.\mu m^2$ (value enabling a level of magnetoresistance of more than 100% to be obtained for magnetoresistive stacks with an MgO base), current density pulses j=$10^7$ A/cm$^2$ signifies voltage pulses V=RA.j of 1V, which is very close to the electrical breakdown voltage of the tunnel barrier in these magnetoresistive stacks. The switching current density should therefore be reduced in order to lower the breakdown risk for the tunnel barrier of the magnetoresistive stack during writing cycles. This is the purpose of adding the polarisation layer 205. The second spacer 204 and the perpendicular magnetisation polarisation layer 205 are therefore added to the aforementioned bi-stable magnetoresistive element. In doing this, a second spin transfer contribution is added, originating from the polarisation of the current induced by the perpendicular polarisation layer 205. However, this second spin transfer contribution exerted on the storage layer 203 is designed to be lower than the contribution provided by the reference layer 201. Thus, the storage layer 203 remains a bi-stable component, despite the presence of the perpendicular polarisation layer 205. Under these conditions, the magnetisation of the storage layer 203 does not become involved in a maintained precession movement, but continues to switch with respect to the magnetisation of the reference layer as for the example of the magnetoresistive element alone, i.e. towards the parallel state if the electrons pass from the reference layer to the storage layer and towards the anti-parallel state if the electrons pass from the storage layer to the reference layer. This phenomenon is illustrated in FIGS. 7 A and 7 B, which represent the variations in the magnetisation component My following an Oy axis parallel to the plane of the layers according to the time in which the layers are traversed by a positive or negative continuous current (J>0 or J<0). P and AP refer to the initial parallel or anti-parallel states respectively, between the magnetisation direction of the reference layer 201 and the magnetisation direction of the storage layer 203. Bi-stable behaviour is observed. The parallel state is promoted (FIG. 7 A) by passing the electrons from the reference layer 201 to the storage layer 203: in other words, if the initial state is AP, the action of passing a current J>0 leads to a transition to state P; if the initial state is P, state P is kept when a current J>0 is passed. Conversely, the anti-parallel state is promoted (FIG. 7 B) by passing the electrons from the storage layer to the reference layer. Once the magnetisation has switched, it remains in this new state and does not continue to rotate as in the documents from the prior art (and in particular in patent request FR2817998). When this is crossed by a continuous current perpendicular to its interfaces, a structure from the prior art with a perpendicular polariser involves maintained oscillations of My, i.e. resistance. However, the device according to this invention has a substantially invariant or substantially stepped resistance according to the initial magnetic state and the current direction as represented in the images shown in FIGS. 7 A and 7 B.

The benefit obtained from adding the perpendicular magnetisation polarisation layer 205 comprises two main advantages:

It enables the critical switching current density to be reduced (typically by a factor of 2 to 10). The spin transfer originating from the polarisation layer 205 provides an additional torque to the magnetisation of the storage layer 203 that is added to the torque provided by the reference layer 201 and thus helps in switching the magnetisation of the storage layer 203. Thus, the storage layer 203 can be switched at a lower current density than in the situation where the polarisation layer 205 is not present. It should be noted that the polarisation layer 205 alone is not enough to switch and all the more make the magnetisation of the storage layer 203 precess;

the presence of the polarisation layer 205 reduces the stochastic fluctuations in the switching time of the magnetisation of the storage layer 205. In fact, without this polarisation layer 205, the magnetisations of the storage and reference layers are initially parallel or anti-parallel. As a result, the spin transfer torque exerted at the very beginning of the switch is very weak, as this torque varies with the sine of the angle between the magnetisations of the reference and storage layers (sine is equal to zero when the state is parallel or anti-parallel). Therefore, without the polarisation layer 205, the magnetisation switching is activated in a random manner when a thermal fluctuation deviates the magnetisation of the storage layer from its direction of equilibrium. However, in the presence of the polarisation layer 205, the situation is not the same. In fact, the magnetisation of the polarisation layer 205 is substantially orthogonal to that of the storage layer 203. The spin transfer torque is therefore at its maximum as from the very beginning of the injection of the writing current pulse. Consequently, although this torque from the polarisation layer 205 is too weak to switch the magnetisation alone, it is nevertheless strong enough to subject the magnetisation to a pulse which diverts it from its position of equilibrium in a very short time of approximately 50 ps. As a result, this enables the spin transfer from the reference layer 201 to very quickly take over and cause the magnetisation of the storage layer 203 to switch. Thus, with the polarisation layer 205, the reversal is no longer activated by a random thermal fluctuation but by the current pulse crossing the magnetic element itself. This makes the switching process much faster and its duration much less fluctuating.

Figure 11:
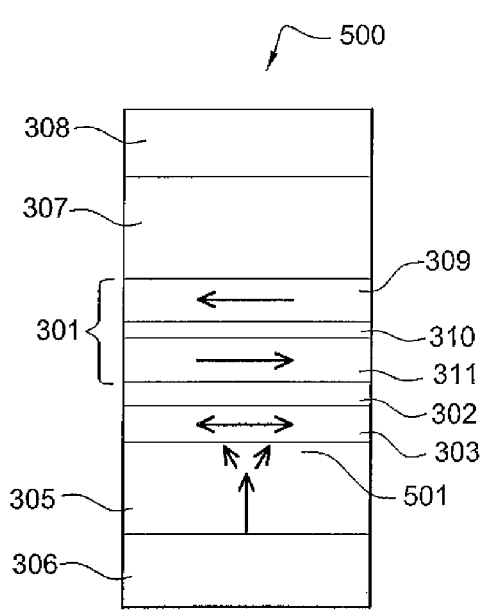
FIG. 11 represents a third mode of embodiment of the invention.

In reference to FIG. 11, it can be observed that the second spacer 204 can be omitted, the layer 205 of spin polarised electrons with a magnetisation out of the plane of the polarisation layer and with a direction perpendicular to that of the reference layer 201, being thus directly coupled with the storage layer 203.

The storage layer 203 can be a simple magnetic layer (for example comprised of CoFeB) or comprised of multiple coupled magnetic layers (for example CoFe/CoFeB). The storage layer 203 can also be a synthetic antiferromagnetic layer, i.e. comprised of two ferromagnetic layers coupled in an anti-parallel direction through a thin anti-parallel coupling layer, for example comprised of ruthenium with a thickness of between 0.6 nm and 0.8 nm. The advantage of such a structure is to present improved thermal stability with respect to the thermal magnetisation fluctuations.

The reference layer 201 can be a simple layer anchored by an antiferromagnetic layer. The reference layer can be an alloy with a Co, Fe, Ni base containing additives, in particular B, Cr, Pt, Pd, Zr and Nb. The reference layer can also be made out of a semi-metallic material, in particular from the family of Heusler alloys such as Ni2MnAl, Ni2MnIn, Ni2MnSn, Ni2MnSb, Co2MnAl, Co2MnSi, Co2MnGa and Co2MnGe. In the example of a magnetoresistive stack with a bcc MgO base, this layer must also, preferably, have a body cubic centred structure close to the interface. It can be an alloy with a bcc Co, Fe and Ni base or an amorphous CoFeB alloy that is annealed after deposition of the stack. The aforementioned Heusler alloys would also suffice. The reference layer can also, advantageously, be a synthetic antiferromagnetic layer comprised of two ferromagnetic layers coupled in an anti-parallel direction through a thin anti-parallel coupling layer, for example comprised of ruthenium with a thickness of between 0.6 nm and 0.8 nm. This synthetic antiferromagnetic layer can itself be anchored by interaction with an antiferromagnetic layer. The advantage of using an anchored synthetic layer is being able to reduce the magnetostatic field radiated by the reference layer onto the storage layer and thus avoid one magnetisation direction of the storage layer being promoted with respect to the other.

The layer 205 of spin polarised electrons can also be a synthetic antiferromagnetic layer. It can also be anchored by an antiferromagnetic layer.

It should be noted that, instead of using planar magnetisation layers for the storage layer 203 and reference layer 201 and an out-of-plane magnetisation layer, perpendicular to the magnetisation of the storage layer 203, for the spin polarizing layer 205, all of these magnetisations can be rotated by 90°, i.e. out-of-plane magnetisation layers can be used for the storage layer 203 and reference layer 201 and a planar magnetisation layer for the layer 205 of spin polarised electrons.

Figure 8:
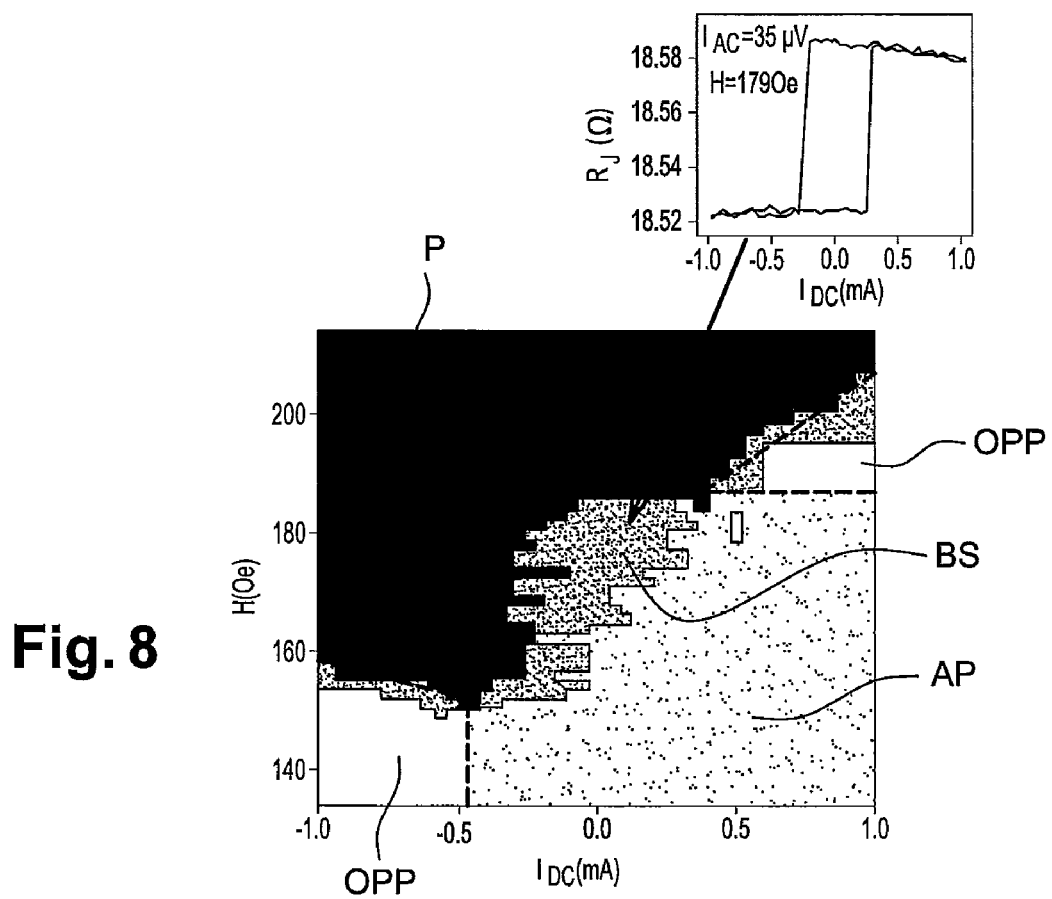
FIG. 8 represents an example of a stability diagram (current-field) of a device according to the invention.

The stability diagram (current-field) of a device according to the invention is represented in FIG. 8 with a curve R(I) illustrating the development of the resistance with respect to the current.

Five areas can be clearly observed:
a first black area P corresponding to a parallel alignment of the magnetisation of the storage layer 203 with that of the reference layer 201;
a second dark grey area BS corresponding the bi-stability of the magnetisation of the storage layer 203;
a third light grey area corresponding to an antiparallel alignment of the magnetisation of the storage layer 203 with that of the reference layer 201;
a fourth and fifth OPP area (Out-of-Plane Precession) of the magnetisation of the storage layer 203.

A central area BS of Parallel (P)/Anti-parallel (AP) bi-stability is thus observed with an "almond" shape, which ends with narrow current regions, where the switch from state P to state AP can be easily achieved with relatively low current variations. This particular form of the phase diagram obtained by combining a reference layer 201 playing the dominating role in the magnetisation dynamics and a perpendicular polarisation layer 205 playing a secondary role, enables the bi-stable property to be obtained, associated with a critical switching current density by spin transfer much lower than that of the state of the art.

It should be noted that the region of bi-stability in the phase diagram represented in FIG. 8 is centred around a non-zero field value (in this example equal to 173Oe). This field in fact corresponds to a magnetostatic field radiated by the reference layer 201 onto the storage layer 203. This field can be cancelled by using a reference layer 201 referred to as a synthetic antiferromagnetic layer, i.e. formed from two layers with substantially the same magnetic moment coupled in an anti-parallel direction with each other through a layer of ruthenium with a typical thickness of approximately 0.6 nm. Thus, the fields radiated by these two layers at the level of the storage layer compensate each other, which enables the region of bi-stability to be centred around the zero field.

The hysteresis loop R(I) displayed in the upper right-hand corner of FIG. 8 has a switching current corresponding to a current density of approximately $2.10^6$ A/cm$^2$, i.e. an order of magnitude below this same device without a perpendicular polarisation layer. This cycle corresponds to the resistance values of the device 200 according to the current crossing it when moving over a horizontal line corresponding to a field of 179Oe in the stability diagram and enables the two stable resistance values to be observed in the bi-stability area BS corresponding to the states P and AP.

According to this invention, the spin transfer coefficient between the reference layer 201 and the storage layer 203 must be higher than the spin transfer coefficient between the spin polarisation layer 205 and the storage layer 203. In order to achieve this, several solutions are possible:

The shape of the magnetic element can be modified and more generally its uni-axial anisotropy. The storage layer 203 can be given a uni-axial anisotropy with an easy axis of magnetisation substantially parallel to the magnetisation direction of the reference layer. As previously explained, this uni-axial anisotropy can be shape anisotropy obtained by giving the element an extended shape (elliptical, rectangular, stretched hexagonal, etc.). This can also refer to magnetocrystalline anisotropy if the layer is grown epitaxially with an easy axis according to the reference layer 201 or polycrystalline but with a grainy texture giving a uni-axial anisotropy substantially parallel to the magnetisation of the reference layer 201. Uni-axial anisotropy can also be induced by deposition at oblique incidence as described for example in the article "Influence of deposition angle on the properties of NiO spin-valves" (M. Cartier, S. Auffret, P. Bayle-Guillemaud, F. Ernult, F. Fettar and B. Dieny, Journal-of-Applied-Physics. vol. 91, no. 3; 1 Feb. 2002; p. 1436-43).

The current polarisation originating from the perpendicular polarisation layer 205 can also be modified. Current polarisation can be reduced by introducing layers or impurities of Pt or Mn within the polarisation layer, which are known to generate spin flip, which can contribute to lowering the influence of the spin transfer of the perpendicular polarisation layer on the storage layer. However, this contribution must not be lowered by a too large extent so that the benefits of the perpendicular polarisation layer remain.

The role of the spin transfer exerted by the reference layer 201 on the storage layer 203 can also be increased. In order to achieve this, the use of reference 201 and/or non-magnetic 202 tunnel barrier layers is preferred providing a strong spin polarisation of the tunnel electrons. The MgO tunnel barriers associated with the Co, CoFe or CoFeB electrodes are known to provide such significant polarisations. A reference electrode can also be used, based on semi-metallic materials such as the Heusler alloys.

For simplification purposes, the current feeds and current switching means enabling an electrical current to pass perpendicular to the plane of the stack of magnetic layers have been purposefully omitted in the following description of FIGS. 9 to 13.

Figure 9:
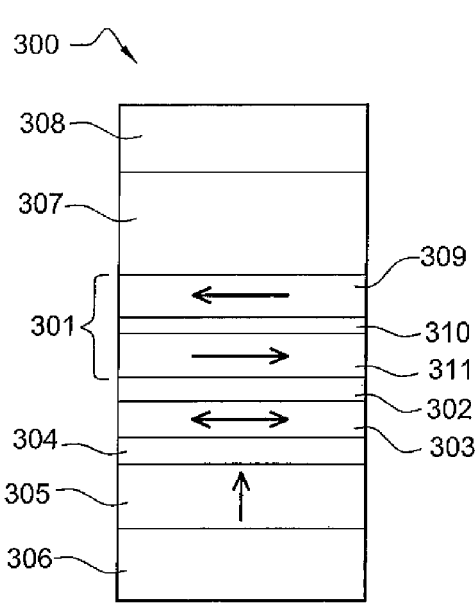
FIG. 9 represents a first mode of embodiment of the invention.

FIG. 9 represents a first mode of embodiment of a magnetic device 300 according to the invention.

The magnetic device 300 comprises a stack formed from:
a protection layer 308;
an antiferromagnetic anchoring layer 307;
a magnetic reference layer 301 with a fixed magnetisation direction (in this case located in the plane of the reference layer);
a first non-magnetic spacer 302;
a magnetic storage layer 303 with a magnetisation capable of being redirected according to two substantially opposite states of direction (two positions of equilibrium substantially following the axis defined by the fixed magnetisation direction of the reference layer 301);
a second spacer 304;
a layer 305 of spin polarised electrons with a magnetisation located out of the plane of the polarisation layer and with a direction perpendicular to that of the reference layer 301;
a buffer layer 306.

The reference layer 301 is, in this example, a synthetic antiferromagnetic layer comprising two ferromagnetic layers 311 and 309 coupled in an anti-parallel direction through a thin anti-parallel coupling layer 310, for example comprised of ruthenium with a thickness of between 0.6 nm and 0.8 nm. In the event where the first non-magnetic spacer 302 is an MgO tunnel barrier, this synthetic antiferromagnetic reference layer 301 comprises a layer 311 of CoFeB with a thickness of between 1.5 and 4 nm in contact with the MgO barrier 302, a layer 310 of ruthenium with a thickness of between 0.6 and 0.9 nm and a layer 309 of CoFe with a typical thickness of between 2 and 4 nm. This last magnetic layer 309 is, in this example, anchored by the antiferromagnetic layer 307, for example made out of Ir20Mn80 with a thickness of 7 nm or made out of PtMn with a thickness of 20 nm.

The antiferromagnetic anchoring layer 307 is covered by the protection layer 308 serving to protect this anchoring layer from oxidation when exposed to air during the manufacturing process and also serving as an electrical contact with the upper electrode of the stack.

The storage layer 303 is a layer with magnetisation in the plane of the layer with a variable magnetisation direction and with two positions of equilibrium substantially following the axis defined by the fixed magnetisation direction of the reference layer 301, for which the magnetisation direction is fixed in the plane of the reference layer. The storage layer 303 must be sufficiently thermally stable so that the magnetisation can remain within its assigned direction for a duration of 10 years. This requires a uni-axial anisotropy K such as $KV>50k_BT$ where V is the volume of this layer, $k_B$ is the Boltzmann constant and T is the temperature. Uni-axial anisotropy can have various origins: this can be shape anisotropy obtained by giving the magnetic element an extended shape (for example an elliptical shape with an aspect ratio typically between 1.5 and 2.5 or an extended hexagon or rectangle shape). This can also be anisotropy of magnetocrystalline origin, obtained by inducing a particular texture in the plane, for example with the use of hexagonal structure material (CoCr-type), of which the c-axis is directed in the plane. This can also be an anisotropy connected to the restrictions obtained for example by performing deposition at oblique incidence as described for example in the article "Influence of deposition angle on the properties of NiO spin-valves", M. Cartier, S. Auffret, P. Bayle-Guillemaud, F. Ernult, F. Fettar and B. Dieny, Journal-of-Applied-Physics. vol. 91, no. 3; 1 Feb. 2002; p. 1436-43. Generally, this storage layer 303 can be created from an alloy with a Co, Fe, Ni base containing additives, in particular B, Cr, Pt, Pd, Zr and Nb. The storage layer 303 can also be made out of a semi-metallic material, in particular from the family of Heusler alloys such as Ni2MnAl, Ni2MnIn, Ni2MnSn, Ni2MnSb, Co2MnAl, Co2MnSi, Co2MnGa and Co2MnGe. In the example of a magnetoresistive stack with a bcc MgO base, this storage layer 303 must also, preferably, have a bcc structure close to the interface. An alloy with a bcc Co, Fe and Ni base is thus chosen, or an amorphous CoFeB alloy which is subsequently annealed after deposition. The aforementioned Heusler alloys would also suffice.

The layer 305 of spin polarised electrons has a magnetisation located out of the plane of the polarisation layer and a direction perpendicular to that of the reference layer 301.

Such a layer 305 can be comprised of different types of material:

Multilayers comprising (Pt/Co), (Pd/Co) or (Pt/Co/Pt/Ni) repeats as described by G. Srivinas et al (thin Solid Films 301 (1997) 211);

multilayers formed by alternating ultra-thin layers of Co and Ni, for example multilayers consisting of (Co 0.2 nm/Ni 0.4 nm) repeats (refer to F. den Broeder et al, Appl. Phys. Lett. 61, 1468 (1992));

Some multilayers formed by alternating magnetic transition metal/oxide such as CoFe/Alumina, which also show significant out-of-plane anisotropies resistant to temperatures of up to 250° C. This is described in more detail in the patent request FR2910716;

FePt or FePd ordered alloys with Curie temperature of approximately 700K and which maintain an out-of-plane anisotropy for up to 250° C.;

CoPt or CoPd alloys with Co concentrations of between 85 at. % and 50 at. % as described in the article by J. Ariake et al (Journ. Magn. Magn. Mater. 287 (2005) 229);

CoCr alloys with a hexagonal structure and a c-axis perpendicular to the plane of the layers, such as those with a composition close to $Co_{80}Cr_{20}$ used in media for perpendicular magnetic recording;

some rare-earth/transition metal alloys such as TbFeCo, also with out-of-plane anisotropies capable of being maintained at temperatures of up to 250° C. One example of production of a magnetoresistive stack with out-of-plane magnetisation and based on such alloys is given in article: N. Nishimura et al (Journ. Appl. Phys. 91, 5246 (2002)).

Optionally, different improvements can be provided to the composition of this layer 305 of polarised spin electrons with a fixed magnetisation directed out-of-plane. These are described below:

One advantage could be to add a thin layer (not represented) of magnetic material between this fixed magnetisation layer 305 and the second spacer 304 separating this fixed magnetisation layer 305 from the storage layer 303, also with an out-of-plane magnetisation by exchange coupling with the fixed magnetisation layer. The purpose of this additional magnetisation layer is to control or even reinforce the polarisation of the current being injected into the storage layer originating from this additional polariser. In fact, as previously explained, the contribution of spin transfer originating from the layer 305 of spin polarised electrons with an out-of-plane magnetisation (perpendicular polariser) must be made so as to be lower than the contribution of spin transfer from the reference layer 311. One example could include this additional layer being comprised of a thin layer of Co of 1 to 2 nm in thickness, containing one or two very thin layers of another metal. This other metal could be Cu with a thickness of 0.3 nm if the polarisation of the spin current originating from the layer 305 of spin polarised electrons with an out-of-plane magnetisation is to be increased, or, on the other hand, this other metal could be Pt or Mn if this layer is to be decreased.

Another advantage could involve replacing the layer 305 of spin polarised electrons with an out-of-plane, fixed magnetisation with a layer referred to as a synthetic antiferromagnetic layer comprised of two layers of fixed magnetisation directed out-of-plane and coupled in an antiparallel direction with a layer capable of inducing an antiferromagnetic coupling between the adjacent ferromagnetic layers, such as for example, a thin layer of Ruthenium with a thickness of 0.5 to 0.9 nm. For example, a layer of fixed magnetisation can be created comprised of (Co 0.25 nm/Ni 0.4 nm)$_6$/Ru 0.6 nm/(Co 0.25 nm/Ni 0.4 nm)$_4$. The advantage of replacing the only fixed magnetisation layer with such a synthetic antiferromagnetic structure is to anchor the magnetisation of the fixed magnetisation layer even further and therefore make it resistant to the magnetic disturbances.

Following the same idea, in order to reinforce the anchoring of the layer 305 of spin polarised electrons with an out-of-plane fixed magnetisation, this simple or synthetic antiferromagnetic magnetisation layer can be coupled with an antiferromagnetic layer, for example comprised of PtMn with a typical thickness of 12 to 20 nm or of IrMn with a typical thickness of 6 to 10 nm. The exchange interaction between the antiferromagnetic layer and the adjacent ferromagnetic layer has the effect of anchoring the magnetisation of the adjacent ferromagnetic layer. This technique is particularly used for spin valves or magnetoresistive stacks and also operates with an anisotropy perpendicular to the plane of the layers, as described in the article: "Pinned synthetic ferrimagnets with perpendicular anisotropy and tunable exchange bias" (J. Sort, B. Rodmacq, S. Auffret, and B. Dieny, Appl. Phys. Lett. 83, 1800 (2003)).

The purpose of the buffer layer 306 is to promote a good quality growth in the entire structure and establish the electrical contact with the lower electrode. This can involve layers of CuN, Ta, NiFeCr, Ru, Pt, Cu or multilayers (Cu/Ta). In these multilayers, the purpose of alternating copper and tantalum layers is to stop the increase in size of the copper grains to prevent these from becoming too large. In fact, the formation of large grains of copper is often accompanied by a significant level of roughness of the surface of this layer 306. The thickness of this layer 306 can vary from 1 to several hundred nm.

As previously stated, in the device according to the invention, the electrical resistance of the stack constituted from the reference layer 301/the first spacer 302/the storage layer 303 is designed so as to be higher than the electrical resistance of the stack constituted from the polarisation layer 305/the second spacer 304.

In order to achieve this, the stack constituted from the reference layer 301/the first spacer 302/the storage layer 303 is advantageously a magnetoresistive stack. In order to achieve this, the first spacer 302 can be a tunnel barrier with a MgO, AlOx, TiOx, SrTiO3, HfOx or TaOx base. This magnetoresistive stack will be characterised by a product RA of its resistance R multiplied by its surface area A, which is typically approximately 0.5 to 30 Ohm.micron$^2$.

In this example, the second spacer 304 is, for example, a tunnel barrier with a lower product RA than that constituting the first spacer 302. It can be comprised of the same material as the first spacer 302 (for example from MgO or AlOx), however with a lesser thickness or from a different material, preferably with a low barrier height so that its electrical resistance is lower than that of the first spacer 302.

In an alternative manner, this second spacer 304 can be a confined current paths layer. Such a layer is constituted from an insulating layer comprising traversing conducting paths with a typical diameter of 1 to several nanometers. Such a layer is, for example, formed by oxidation of an Al99Cu1 alloy. During the oxidation process, the aluminium is oxidised to AlOx, whereas the copper, which is less easily oxidised than the aluminium, coalesces into small clusters forming the conducting paths. By modifying the density and size of the conducting paths, the product RA can be adjusted to the desired value.

According to the invention, the product RA of the second spacer 304 is preferably at least 2 times lower than the product RA of the first spacer 302 so that the tunnel magnetoresistance of the magnetoresistive stack containing the first spacer 302 is not too diluted by the serial resistance of the second spacer 304.

In the particular example where the second spacer 304 is a confined current paths structure, the metallic precipitates forming the current paths through the insulating layer can be magnetic, for example made out of Co.

If the first spacer 302 is a tunnel barrier, the second spacer 304 can therefore be a metallic, non-magnetic spacer, for example made out of copper or gold. This second spacer 304 must be capable of transmitting the electrons from the polarisation layer with vertical magnetisation to the storage layer 303, while preserving the spin polarisation of the electrons. The appropriate length is the spin diffusion length, typically being 20 nm in copper. The thickness of the second spacer 304 must therefore be lower than this length. A typical thickness of 3 to 5 nm can be used.

It should be noted that the first spacer 302 can also be a confined current paths layer as previously described for the second spacer 304. However, in this example, in order to ensure that the second spacer 304 has a lower resistance than the first spacer 302, the second spacer 304 must be a confined current paths layer with more metallic paths (more numerous and/or larger) than in the first spacer 302 or that the second spacer 304 must be a metallic non-magnetic layer capable of transmitting the spin polarisation of the electrons, such as copper for example.

The two spacers 302 and 304 can finally be two metallic layers, the reference layer 301/spacer 302/storage layer 303 structure thus being a highly magnetoresistive structure. However, this situation is, a priori, not the most favourable for a memory-type application as the total resistance of the stack will be low with respect to the resistance of the transistor or other selection device that will be connected in series.

Even if the description of this mode of embodiment is based on a synthetic reference layer 301, it should be noted that the reference layer can also be constituted from an alloy with a Co, Fe, Ni base possibly containing additives, in particular B, Cr, Pt, Pd, Zr and Nb. The reference layer 301 can also be made out of a semi-metallic material, in particular from the family of Heusler alloys such as Ni2MnAl, Ni2MnIn, Ni2MnSn, Ni2MnSb, Co2MnAl, Co2MnSi, Co2MnGa and Co2MnGe. In the example of junctions with a bcc MgO base, this reference layer 301 must also, preferably, have a bcc structure close to the interface. An alloy with a bcc Co, Fe and Ni base is chosen, or an amorphous CoFeB alloy that is subsequently annealed after deposition.

Figure 10:
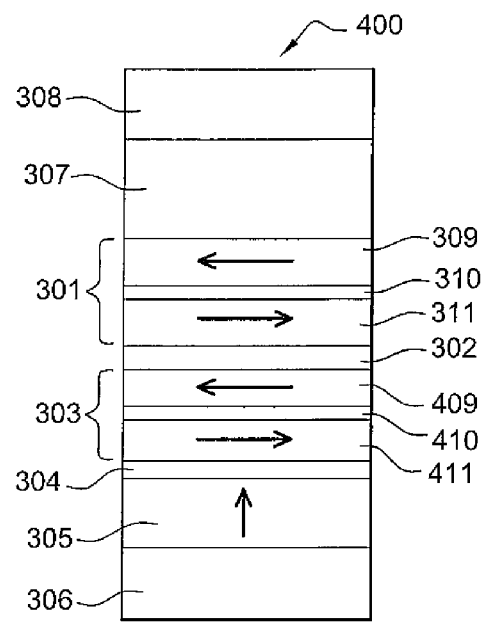
FIG. 10 represents a second mode of embodiment of the invention.

It should be noted that, in order to increase the thermal stability of the storage layer 303, a synthetic storage layer can advantageously be used. Such a structure is illustrated in FIG. 10, which represents a magnetic device 400 according to a second mode of embodiment of the invention. The different layers of the magnetic device 400 are identical to the layers of the magnetic device 300 previously described and have the same references and characteristics, with the only difference consisting in using a synthetic storage layer 303, i.e. comprised of two ferromagnetic layers 409 and 411 coupled in an anti-parallel direction through an anti-parallel coupling layer 410 such as ruthenium with a thickness of 0.6 nm to 0.8 nm. In doing this, the volume of the storage layer 310 is increased and its internal field is made more uniform. As a result, the magnetisation switch by spin transfer is produced in a more coherent manner, which enables the critical reversal current to be lowered. If the first spacer 302 is an MgO tunnel barrier, the composition of the synthetic storage layer 303 can be a CoFe/Ru/CoFeB-type layer. The layer 409 of CoFeB with a typical thickness of 1.5 to 4 nm will advantageously be in contact with the MgO tunnel barrier 302 in order to provide a high level of tunnel magnetoresistance to the structure. The layer 410 of Ru will have a thickness of 0.6 to 0.9 nm, providing an anti-parallel coupling between the adjacent ferromagnetic layers 409 and 410.

FIG. 11 represents a third mode of embodiment of a magnetic device 500 according to the invention. The different layers of the magnetic device 500 are identical to the layers previously described with reference to device 300 and have the same reference numbers and characteristics, with the only difference consisting in removing the second spacer 304. In the example where the second spacer 304 is omitted, the layer 305 of spin polarised electrons with a magnetisation out of the plane of the polarisation layer and with a direction perpendicular to that of the reference layer 301 is directly coupled with the storage layer 303. As the magnetisations of these two layers 303 and 305 are essentially orthogonal, a magnetic wall 501 will be formed in the thickness of this bi-layer in order to minimise the cost in exchange energy. The magnetisation of the storage layer 303 neighbouring the spacer 302 must be parallel or anti-parallel to that of the reference layer 301 in order to benefit from any amplitude of the magnetoresistance effect of the reference layer 301/spacer 302/storage layer 303 stack. This means that the thickness of wall 501 must be substantially lower than the thickness of the storage layer 303. In order to achieve this, the exchange interaction between the polarisation layer 305 and the storage layer 303 must be adjusted in order to meet this condition. In fact, the width of the wall 501 which will be formed in the thickness will be approximately the width of a Bloch wall, i.e. in $(A/K)^{1/2}$ where A is the exchange stiffness constant and K is the anisotropy. The anisotropy is large in the materials with out-of-plane magnetisation (typically between approximately several $10^6$ to $10^7$ erg/cm$^3$) and the exchange stiffness constant can be approximately $10^{-7}$ erg/cm, leading to wall widths of approximately 1 nm, which is the desired order of magnitude. If the storage layer 303 is typically between approximately 2 to 4 nm in thickness, a wall width in the thickness of 1 nm is appropriate.

When a storage layer 303 with planar magnetisation is used, the direct coupling of the storage layer 303 with the perpendicular magnetisation polarisation layer can present a significant advantage. In fact, for a planar magnetisation layer into which in-plane polarised electrons are injected (in the example of electrons originating from the reference layer 301), the critical current density for switching by spin transfer is given by the expression:

$$\frac{\hbar}{d}\frac{J}{e}P = \alpha\left(\frac{\mu_0 M_s^2}{2} + 2K\right).$$

In this expression, J is the current density, P is the current polarisation, p is the magnetic permittivity ($4\pi 10^{-7}$ SI), e is the electron charge, $M_s$ is the spontaneous magnetisation of the storage layer, d is its thickness, K is its uni-axial anisotropy and a is the Gilbert damping constant. In the expression of the critical switching current, the dominating term is $$\alpha\frac{\mu_0 M_s^2}{2}.$$

This term translates the difficulty that the magnetisation of the storage layer 303 has in moving out of the plane during its precession movement accompanying its switching. If the magnetisation of the storage layer 303 is now directly coupled with the perpendicular polarisation layer as in the example of magnetic device 500, this will ease its capacity in going out of the plane. In fact, the storage layer 303 with planar magnetisation will tend to be drawn out of the plane by the exchange interaction with the polarisation layer 305. The energy of the demagnetising field $$\frac{\mu_0 M_s^2}{2}$$

can typically be reduced by a factor of 2 or even more thanks to this interaction, which enables the critical switching current density to be reduced equivalently.

As previously mentioned, instead of using planar magnetisation layers for the storage layer and reference layer, and an out-of-plane magnetisation layer for the additional polarisation layer, all of these magnetisations can be rotated by 90°, i.e. out-of-plane magnetisation layers can be used for the storage layer and reference layer, and a planar magnetisation layer for the additional polarisation layer. This 90° rotation of the magnetisation is hereinafter described with reference to the two modes of embodiment in FIGS. 12 and 13. In each of these figures, the reference layer has a fixed magnetisation direction located perpendicular to the plane of the reference layer; the storage layer has a variable magnetisation direction with two positions of equilibrium substantially following the axis defined by the fixed magnetisation direction of the reference layer; the layer of spin polarised electrons has a magnetisation perpendicular to that of the reference layer and located in the plane of the polarisation layer.

Figure 12:
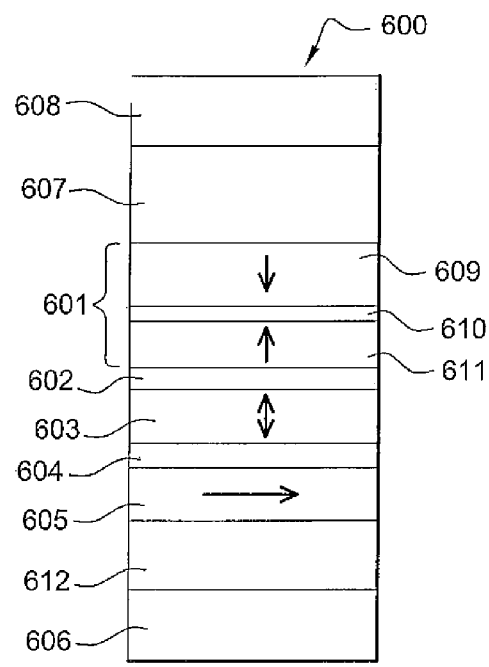
FIG. 12 represents a fourth mode of embodiment of the invention.

FIG. 12 represents a fourth mode of embodiment of a magnetic device 600 according to the invention.

The magnetic device 600 comprises a stack formed from:
a protection layer 608;
a first antiferromagnetic anchoring layer 607;
a magnetic reference layer 601 with a fixed magnetisation direction (in this case located perpendicular to the plane of the reference layer);
a first non-magnetic spacer 602;
a magnetic storage layer 603 with a magnetisation capable of being redirected according to two substantially opposite states of direction (two positions of equilibrium substantially following the axis defined by the fixed magnetisation direction of the reference layer 601);
a second spacer 604;
a layer 605 of spin polarised electrons with a magnetisation located in the plane of the polarisation layer and with a direction perpendicular to that of the reference layer 601;
a second antiferromagnetic anchoring layer 612;
a buffer layer 606.

The purpose of the buffer layer 606 is to promote a good quality growth in the entire structure and establish the electrical contact with the lower electrode. This can involve layers of CuN, Ta, NiFeCr, Ru, Pt, Cu or multilayers (Cu/Ta). In these multilayers, the purpose of alternating copper and tantalum layers is to stop the increase in size of the copper grains to prevent these from becoming too large. In fact, the formation of large grains of copper is often accompanied by a significant level of roughness of the surface of this buffer layer 606. The thickness of this buffer layer 606 can vary from 1 to several hundred nm.

The reference layer 601 is, in this example, a synthetic antiferromagnetic layer comprised of two ferromagnetic layers 611 and 609 coupled in an anti-parallel direction through a thin anti-parallel coupling layer 610, for example comprised of ruthenium with a thickness of between 0.6 nm and 0.8 nm. The reference layer 601 is, for example a synthetic antiferromagnetic layer comprised of (Co 0.25 nm/Ni 0.4 nm)$_6$/Ru 0.6 nm/(Co 0.25 nm/Ni 0.4 nm)$_8$. The advantage of using a synthetic reference layer is to reduce the magnetostatic field exerted by this layer on the magnetisation of the storage layer. It is important that this radiated field is low so as not to excessively disymmetrise the two magnetisation states of the storage layer 603 ("upwards" state and "downwards" state). The synthetic reference layer 601 is itself anchored by interaction with a first antiferromagnetic anchoring layer 607, for example made out of IrMn with a thickness of 7 nm. This antiferromagnetic anchoring layer 607 may be omitted if the coercivity of the synthetic reference layer 601 is large enough, typically 2 kOe or more.

The antiferromagnetic anchoring layer 607 is covered by the protection layer 608 serving to protect this anchoring layer from oxidation when exposed to air during the manufacturing process and also serving as an electrical contact with the upper electrode of the stack.

In this mode of embodiment, the storage layer 603 has an out-of-plane magnetisation. This storage layer can be created from different types of materials such as:
Multilayers comprising (Pt/Co), (Pd/Co) or (Pt/Co/Pt/Ni) repeats (refer to the article by G. Srivinas et al, thin Solid Films 301 (1997) 211);
multilayers formed by alternating ultra-thin layers of Co and Ni, for example multilayers comprising repeats of (Co 02 nm/Ni 0.4 nm) (refer to the article by F. den Broeder et al, Appl. Phys. Lett. 61, 1468 (1992));

some magnetic transition metal/oxide multilayers such as CoFe/Alumina also show significant out-of-plane anisotropies resistant to temperatures of up to 250° C. This is described in more detail in the patent request FR2910716;

FePt or FePd ordered alloys;

CoPt or CoPd alloys with Co concentrations of between 85 at. % and 50 at. % as described in the article by J. Ariake et al (Journ. Magn. Magn. Mater. 287 (2005) 229);

CoCr alloys with a hexagonal structure and a c-axis perpendicular to the plane of the layers, such as those with a composition close to $Co_{80}Cr_{20}$ used in media for perpendicular magnetic recording;

some rare-earth/transition metal alloys such as TbFeCo, also with out-of-plane anisotropies. One example of embodiment of a magnetoresistive stack with an out-of-plane magnetisation based on such alloys is given in the article by N. Nishimura et al (Journ. Appl. Phys. 91, 5246 (2002)).

Even if the description of this mode of embodiment is based on a synthetic reference layer 601, it should be noted that the reference layer can also be comprised of the same materials as those cited above for the storage layer 603. As for the storage layer 603, in order to maximise the amplitude of the magnetoresistance of the storage layer 603/first spacer 602/reference layer 601 stack, an additional layer made out of magnetic material with a magnetisation drawn out of the plane by exchange interaction with the rest of the storage layer 603 could be advantageously introduced at the interface between the first spacer 602 and the reference layer 601. In the event where the first spacer 602 is a tunnel barrier with a MgO base, this additional magnetic layer will advantageously be made out of CoFeB.

Advantageously, the interface of the storage layer 603 in contact with the second spacer 604 is magnetic in such a way that the spin transfer from the polarisation layer 605 with planar magnetisation can be exerted on the storage layer 603. In the event of (Co/Pt) or (Co/Pd) multilayers, the stack above the second spacer 604 must begin with a magnetic layer, for example made out of Co. Similarly, the interface with the first spacer 602 must be magnetic, which means that the stack comprised of the storage layer 603 must end with a magnetic layer, for example made out of Co, CoFe or CoFeB (advantageously made out of CoFeB if the first spacer 602 is a tunnel barrier made out of MgO).

As previously stated with reference to FIGS. 5, 9, 10 and 11, in the device according to the invention, the electrical resistance of the stack constituted from the reference layer 601/the first spacer 602/the storage layer 603 is designed so as to be higher than the electrical resistance of the stack constituted from the polarisation layer 605/the second spacer 604.

In order to achieve this, the stack constituted from the reference layer 601/the first spacer 602/the storage layer 603 is advantageously a magnetoresistive stack. In order to achieve this, the first spacer 602 can be a tunnel barrier with a MgO, AlOx, TiOx, SrTiO3, HfOx or TaOx base. This magnetoresistive stack will be characterised by a product RA of its resistance R multiplied by its surface area A.

In this example, the second spacer 604 is, for example, a tunnel barrier with a lower product RA than that constituting the first spacer 602. It can be constituted from the same material as the first spacer 602 (for example from MgO or AlOx), however with a lesser thickness or from a different material, preferably with a low barrier height so that its electrical resistance is lower than that of the first spacer 602.

In an alternative manner, this second spacer 604 can be a confined current paths layer. Such a layer is constituted from an insulating layer comprising traversing conducting paths with a typical diameter of 1 to several nanometers. By modifying the density and size of the conducting paths, the product RA can be adjusted to the desired value.

According to the invention, the product RA of the second spacer 604 is preferably at least 2 times lower than the product RA of the first spacer 602 so that the level of tunnel magnetoresistance of the magnetoresistive stack containing the first spacer 602 is not too diluted by the level of serial resistance of the second spacer 604.

In the particular example where the second spacer 604 is a confined current paths structure, the metallic precipitates forming the current paths through the insulating layer can be magnetic, for example made out of Co.

If the first spacer 602 is a tunnel barrier, the second spacer 604 can therefore be a metallic, non-magnetic spacer, for example made out of copper or gold. This second spacer 604 must be capable of transmitting the electrons from the polarisation layer with planar magnetisation to the storage layer 603, while preserving the spin polarisation of the electrons. The appropriate length is the spin diffusion length, typically being 20 nm in the copper. The thickness of the second spacer 604 must therefore be less than this length.

It should be noted that the first spacer 602 can also be a confined current paths layer as previously described for the second spacer 604. However, in this example, in order to ensure that the second spacer 602 has a lower resistance than the first spacer 604, the second spacer 602 must be a confined current paths layer with more metallic paths (more numerous and/or larger) than in the first spacer 604 or that the second spacer 304 must be a metallic non-magnetic layer capable of transmitting the spin polarisation of the electrons, such as copper for example.

The layer 605 of spin polarised electrons with a magnetisation in the plane of the polarisation layer can be an alloy with a .Co, Fe, Ni base possibly containing additives, in particular B, Cr, Pt, Pd, Zr and Nb. The typical thickness of this layer is approximately 2 to 5 nm. This layer 605 can also be comprised of a multilayer, for example made out of Co containing thin Cu inserts with a typical thickness of between 0.2 and 0.4 nm or made out of Ni. The polarisation layer 605 can also be made out of a semi-metallic material, in particular from the family of Heusler alloys such as Ni2MnAl, Ni2MnIn, Ni2MnSn, Ni2MnSb, Co2MnAl, Co2MnSi, Co2MnGa and Co2MnGe.

Figure 13:
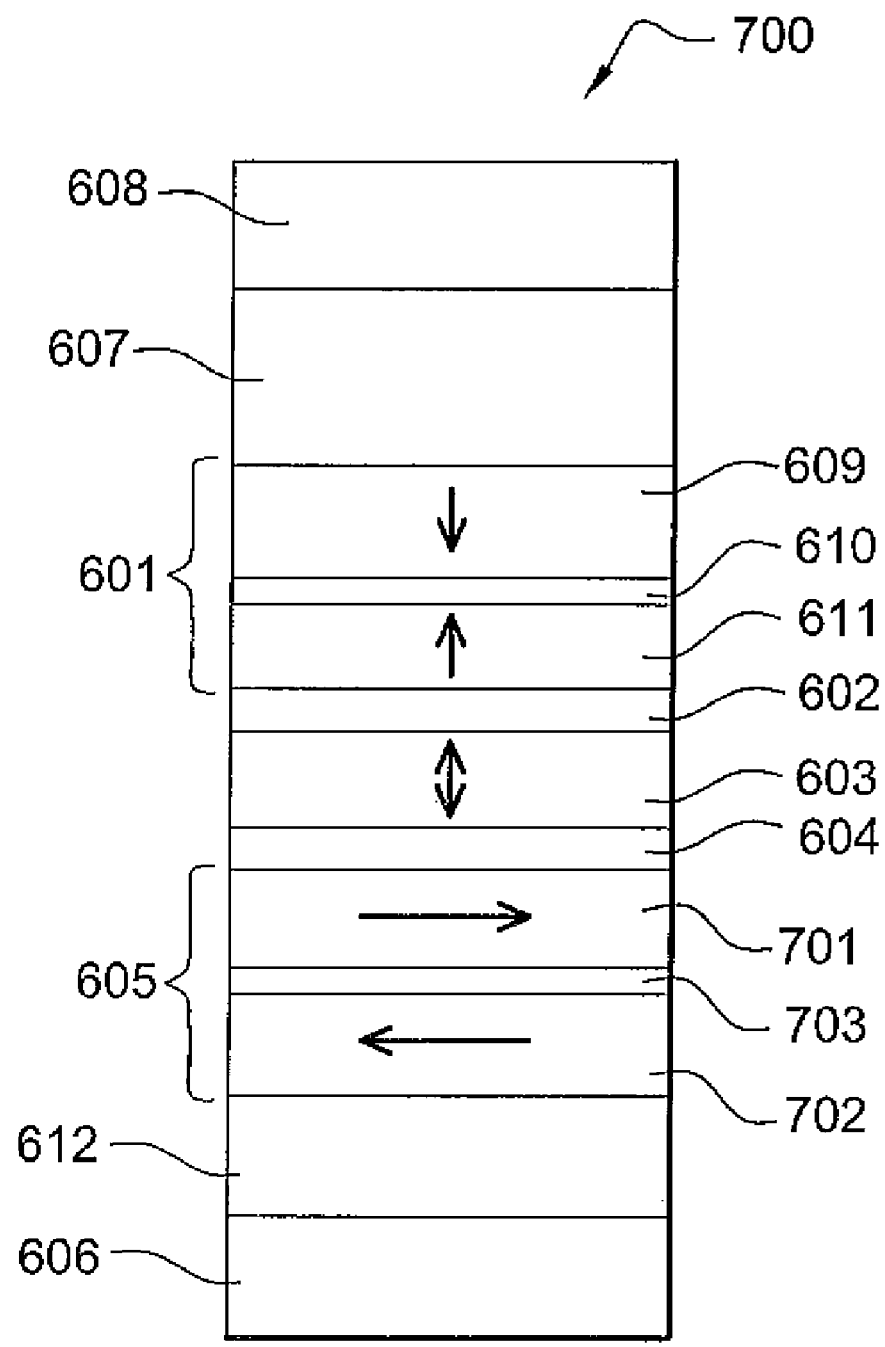
FIG. 13 represents a fifth mode of embodiment of the invention.

FIG. 13 represents a fifth mode of embodiment of a magnetic device 700 according to the invention. The different layers of the magnetic device 700 are identical to the layers previously described with reference to device 700 and have the same reference numbers and characteristics, with the only difference consisting in using a synthetic polarisation layer 605. This polarisation layer 605 with planar magnetisation is therefore a synthetic antiferromagnetic layer, i.e. formed from two magnetic layers 701 and 702 directed in an anti-parallel direction to each other through a thin layer 703 of ruthenium with a thickness of 0.6 to 0.9 nm. The two magnetic layers 701 and 702 can be comprised of the same materials or different materials. This synthetic antiferromagnetic layer is itself anchored by interaction with the antiferromagnetic anchoring sub-layer 612, for example made out of PtMn 20 nm or IrMn 7 nm positioned on the buffer layer 606.

It should be noted that another advantage could involve replacing the storage layer 603 with an out-of-plane switchable magnetisation, as represented in FIGS. 12 and 13, with a synthetic antiferromagnetic layer comprised of two layers of fixed magnetisation with out-of-plane directions and coupled in an anti-parallel direction with a layer capable of inducing an antiferromagnetic coupling between the adjacent ferromagnetic layers, such as for example, a thin layer of Ruthenium with a thickness of 0.5 to 0.9 nm. For example, a layer of switchable magnetisation can be created comprised of (Co 0.25 nm/Ni 0.4 nm)$_6$/Ru 0.6 nm/(Co 0.25 nm/Ni 0.4 nm)$_4$. The advantage of replacing the only switchable magnetisation layer with such a synthetic antiferromagnetic structure is to increase its thermal stability by increasing its volume.

The invention claimed is:

1. A magnetic device comprising:
   a magnetic reference layer with a fixed magnetisation direction located either in the plane of the reference layer or perpendicular to the plane of the reference layer;
   a magnetic storage layer with a variable magnetisation direction;
   a non-magnetic spacer separating said reference layer and said storage layer;
   a magnetic spin polarising layer with a direction perpendicular to that of said reference layer and located out of the plane of the spin polarising layer if the magnetisation of the reference layer is directed in the plane of the reference layer or in the plane of the spin polarising layer if the magnetisation of the reference layer is directed perpendicular to the plane of the reference layer;
   means for passing a current of electrons through and perpendicular to the layers;
   wherein said variable magnetisation direction has two positions of equilibrium substantially following the axis defined by said fixed magnetisation direction of said reference layer, the spin transfer coefficient between said reference layer and said storage layer being higher than the spin transfer coefficient between said spin polarising layer and said storage layer in such a way that, when in the presence of a current of electrons
      the spin transfer between said spin polarising layer and said storage layer moves the magnetisation direction of said storage layer away from a first position of equilibrium parallel or anti-parallel to the magnetisation direction of said reference layer, and,
      the spin transfer between said reference layer and said storage layer causes, according to the direction of the current of electrons
         either the switching of the magnetisation direction of said storage layer towards a second position of equilibrium corresponding to a magnetisation direction of said storage layer opposite to the magnetisation direction of said storage layer in said first position of equilibrium if the direction of the current of electrons is in a first direction;
         or the reversal of the magnetisation direction of said storage layer towards its magnetisation direction in said first position of equilibrium if the direction of the current of electrons is in the direction opposite to the first direction.

2. The device according to claim 1, wherein said storage layer has a uni-axial anisotropy with an easy axis of magnetisation substantially parallel to the magnetisation direction of said reference layer.

3. The device according to claim 2, wherein said storage layer has an extended shape such as an elliptical shape.

4. The device according to claim 1, further comprising a second spacer separating said storage layer and said spin polarising layer.

5. The device according to claim 4, wherein the electrical resistance of the stack formed from said reference layer, said first spacer and said storage layer is higher than the electrical resistance of the stack formed from said second spacer and said spin polarising layer.

6. The device according to claim 4, wherein the product of the resistance multiplied by the surface area of said first spacer is higher than the product of the resistance multiplied by the surface area of said second spacer.

7. The device according to claim 4, wherein said first spacer is a tunnel barrier and said second spacer is chosen from among the following elements:
   a tunnel barrier;
   a confined current paths barrier; and
   a non-magnetic metallic layer.

8. The device according to claim 4, wherein said first spacer is a confined current paths barrier and said second spacer is chosen from among the following elements:
   a confined current paths barrier; and
   a non-magnetic metallic layer.

9. The device according to claim 8, wherein said second spacer is a confined current paths barrier with additional metallic paths and/or magnetic paths with larger diameters than in the first spacer.

10. The device according to claim 4, wherein said first and second spacers are non-magnetic, metallic layers.

11. The device according to claim 1, wherein said spin polarising layer is directly coupled with said storage layer.

12. The device according to claim 1, wherein said reference layer has a fixed magnetisation direction located in the plane of the reference layer and said spin polarising layer has a magnetisation perpendicular to that of said reference layer and located out of the plane of the polarisation layer.

13. The device according to claim 12, said spin polarising layer is created according to one of the following layouts:
   a multilayer comprising (Pt/Co), (Pd/Co) or (Pt/Co/Pt/Ni) repeats;
   a multilayer formed by alternating ultra-thin layers of Co and Ni;
   a multilayer formed by alternating magnetic transition metal/oxide;
   an FePt or FePd ordered alloy;
   a CoPt or CoPd alloy with Co concentrations of between 85 at. % and 50 at. %;
   a CoCr alloy with a hexagonal structure with a c-axis perpendicular to the plane of the layers; and
   a rare-earth/transition metal alloy.

14. The device according to claim 12, wherein said storage layer is created from one of the following materials:
   an alloy with a Co, Fe, Ni base; and
   a Heusler alloy.

15. The device according to claim 12, wherein said reference layer is created according to one of the following materials:
   an alloy with a Co, Fe, Ni base; and
   a semi-metallic material, in particular from the family of Heusler alloys.

16. The device according to claim 1, wherein said reference layer has a fixed magnetisation direction perpendicular to the plane of the reference layer and said spin polarising layer has a magnetisation direction perpendicular to that of said reference layer and located in the plane of the spin polarising layer.

17. The device according to claim 16, wherein said spin polarising layer is created from one of the following materials:
   an alloy with a Co, Fe, Ni base;
   a Co multilayer containing thin Cu or Ni inserts; and
   a semi-metallic material, en particular from the family of Heusler alloys.

18. The device according to claim 16, wherein said storage layer and/or said reference layer are created according to one of the following layouts or materials:
- a multilayer comprising (Pt/Co), (Pd/Co) or (Pt/Co/Pt/Ni) repeats;
- a multilayer formed by alternating layers of Co and Ni;
- a multilayer formed by alternating a magnetic transition metal and an oxide;
- an FePt or FePd ordered alloy;
- a CoPt or CoPd alloy with Co concentrations of between 85 at. % and 50 at. %;
- a CoCr alloy with a hexagonal structure with a c-axis perpendicular to the plane of the layers; and
- a rare-earth/transition metal alloy.

19. The device according to claim 1, wherein at least one of said reference, storage or spin polarising layers is a synthetic antiferromagnetic layer formed from two layers of fixed magnetisation directed outside of the plane and coupled in an anti-parallel direction with a layer capable of inducing an antiferromagnetic coupling between the ferromagnetic layers.

20. The device according to claim 1, wherein at least one of said reference or spin polarising layers has a magnetisation anchored via interaction with an antiferromagnetic anchoring layer.

21. A method of writing/reading information in a device according to claim 1, wherein the writing of information consists of passing a current of electrons through the device, perpendicular to the plane of the layers, the switching of the magnetisation direction of said storage layer towards the second position of equilibrium being performed by injecting a current of electrons in a first direction and the switching of the magnetisation direction of said storage layer towards the first position of equilibrium being performed by injecting a current of electrons in a second direction opposite to said first direction of the current.

22. The method of writing/reading according to claim 21, wherein the reading of information consists of passing a current of electrons through the device, perpendicular to the plane of the layers and in measuring the resistance of said device, the intensity of the reading current being lower than the intensity of the writing current.

23. The device according to claim 14, wherein the alloy with a Co, Fe, Ni base contains at least one additive selected from the group consisting of B, Cr, Pt, Pd, Zr and Nb.

24. The device according to claim 15, wherein the alloy with a Co, Fe, Ni base contains at least one additive selected from the group consisting of B, Cr, Pt, Pd, Zr and Nb.

25. The device according to claim 17, wherein the alloy with a Co, Fe, Ni base contains at least one additive selected from the group consisting of B, Cr, Pt, Pd, Zr and Nb.

* * * * *

UNITED STATES PATENT AND TRADEMARK OFFICE
CERTIFICATE OF CORRECTION

PATENT NO.         : 8,279,666 B2                                              Page 1 of 1
APPLICATION NO.    : 12/787746
DATED              : October 2, 2012
INVENTOR(S)        : Bernard Dieny It is certified that error appears in the above-identified patent and that said Letters Patent is hereby corrected as shown below:

On title page, item (73) Assignees:

replace "Commissariat à l' énergie atomique et aux énergies altenatives"

with -- Commissariat à l' énergie atomique et aux énergies alternatives --

Signed and Sealed this
Twenty-seventh Day of November, 2012

David J. Kappos
*Director of the United States Patent and Trademark Office*